United States Patent
Wu

(10) Patent No.: US 10,958,057 B1
(45) Date of Patent: Mar. 23, 2021

(54) ELECTRONIC DEVICE AND CABLE FIXING DEVICE

(71) Applicant: ACCTON TECHNOLOGY CORPORATION, Hsinchu (TW)

(72) Inventor: Chien-Hua Wu, Miaoli County (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/829,891

(22) Filed: Mar. 25, 2020

(30) Foreign Application Priority Data

Dec. 2, 2019 (CN) .......................... 201922122925.4

(51) Int. Cl.
*H02G 3/30* (2006.01)
*H01R 9/03* (2006.01)
*F16L 3/223* (2006.01)
*F16L 3/13* (2006.01)

(52) U.S. Cl.
CPC .................. *H02G 3/30* (2013.01); *F16L 3/13* (2013.01); *F16L 3/223* (2013.01); *H01R 9/03* (2013.01)

(58) Field of Classification Search
CPC ........ H01R 13/639; H01R 13/72; H01R 9/03; H01R 9/00; H01R 13/00; H01R 13/73; H02G 3/30; H02G 3/32; H02G 3/36; H02G 3/386; F16L 3/13; F16L 3/223
USPC ......... 174/50, 520, 40 CC, 68.1, 68.3, 72 A; 248/49, 68.1, 74.2, 74.1; 385/134, 135; 361/600, 601, 679.02, 724
See application file for complete search history.

(56) References Cited

U.S. PATENT DOCUMENTS

| | | | | |
|---|---|---|---|---|
| 6,970,351 B2* | 11/2005 | Perez | ...................... | G06F 1/181 361/679.57 |
| 7,247,799 B2* | 7/2007 | Mori | ...................... | H02G 3/105 174/135 |
| 7,399,201 B1* | 7/2008 | Khorsand | ............ | H01R 13/506 174/559 |
| 7,622,673 B2* | 11/2009 | Quijano | .................. | G06F 1/181 174/101 |
| 8,254,117 B2* | 8/2012 | Tang | ....................... | G06F 1/181 361/679.57 |
| 8,746,606 B1* | 6/2014 | Murray | .............. | B65H 75/4473 242/407 |
| 8,993,885 B2* | 3/2015 | Chang | ...................... | H02G 3/10 174/50 |
| 9,166,337 B2* | 10/2015 | Boswell | ............. | H01R 13/6395 |

* cited by examiner

*Primary Examiner* — Angel R Estrada
(74) *Attorney, Agent, or Firm* — Birch, Stewart, Kolasch & Birch, LLP

(57) ABSTRACT

An electronic device includes a case engaged with a cable fixing device. The cable fixing device includes at least one first restricting portion and a fixing frame which are connected to the case. The fixing frame could be moved relative to the case between a first position and a second position. The fixing frame has at least one hollow portion for being passed through by a cable and at least one second restricting portion disposed on a peripheral edge of the hollow portion. When the fixing frame is located in the first position, the second restricting portion is away from the first restricting portion. When the fixing frame is located in the second position, the second restricting portion is closer to the first restricting portion than the fixing frame located in the first position. The second restricting portion and first restricting portion jointly restrict a position of the cable.

18 Claims, 27 Drawing Sheets

ELECTRONIC DEVICE AND CABLE FIXING DEVICE

BACKGROUND OF THE INVENTION

Technical Field

The present invention relates generally to a cable fixation of an electronic device, and more particularly to an electronic device and a cable fixing device which could fix cables.

Description of Related Art

General electronic device (such as wireless access point, router, set-top box, and so on) includes a case and at least one port disposed on the case, wherein the port is electrically connected to a circuit board installed inside the case and is adapted to be connected to a cable with a connector, thereby to transmit signals or electricity to the electronic device via the cable.

When the connector is connected to the port, the cable swings out of the case. When the cable is pulled by an external force, the connector is pulled as well. In a mild situation, the electronic device may be slightly moved; in a severe situation, the connector may be pulled out from the port, and thereby affecting the transmission of the signal or the electricity. Conventional cable management method is to tie the cable on a fixed stuff via a cable tie. Even though, when the cable is pulled by the external force, the connector is still possible to be pulled.

Moreover, the more cables are connected to the electronic device, the easier the cables are intertwined together. Therefore, the cable is not easy to manage. The intertwined cables not only look messy, but also affect the transmission of the signal or the electricity.

BRIEF SUMMARY OF THE INVENTION

In view of the above, the primary objective of the present invention is to provide an electronic device and a cable fixing device which could fix cables well.

The present invention provides an electronic device which is adapted to be connected to at least one cable. The electronic device includes a case and a fixing frame, wherein the case having at least one first restricting portion. The fixing frame is detachably engaged with the case and is movable relative to the case between a first position and a second position. The fixing frame has at least one hollow portion and at least one second restricting portion. The at least one hollow portion is adapted to be passed through by the at least one cable, and the at least one second restricting portion is located on a peripheral edge of the at least one hollow portion. When the fixing frame is located in the first position, the at least one second restricting portion is away from the at least one first restricting portion. When the fixing frame is located in the second position, the at least one second restricting portion is moved toward the at least one first restricting portion, so that the at least one second restricting portion and the at least one first restricting portion jointly restrict a position of the at least one cable.

The present invention provides a cable fixing device for an electronic device, which is adapted to be engaged with a case of the electronic device, wherein the case is adapted to be connected to at least one cable, wherein the cable fixing device includes an engaging seat and a fixing frame. The engaging seat is adapted to be engaged with the case and has at least one first restricting portion. The fixing frame is detachable engaged with the engaging seat and is movable relative to the engaging seat between a first position and a second position, wherein the fixing frame has at least one hollow portion and at least one second restricting portion. The at least one hollow portion is adapted to be passed through by the at least one cable, and the at least one second restricting portion is located on a peripheral edge of the at least one hollow portion. When the fixing frame is located in the first position, the at least one second restricting portion is away from the at least one first restricting portion. When the fixing frame is located in the second position, the at least one second restricting portion is moved toward the at least one first restricting portion, so that the at least one second restricting portion and the at least one first restricting portion jointly restrict a position of the at least one cable.

With the aforementioned design, the cables could be fixed on the case, preventing the connection between the cable and the electronic device from being affected when the cable is pulled by the external force. Additionally, the cables could be managed in an orderly manner.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
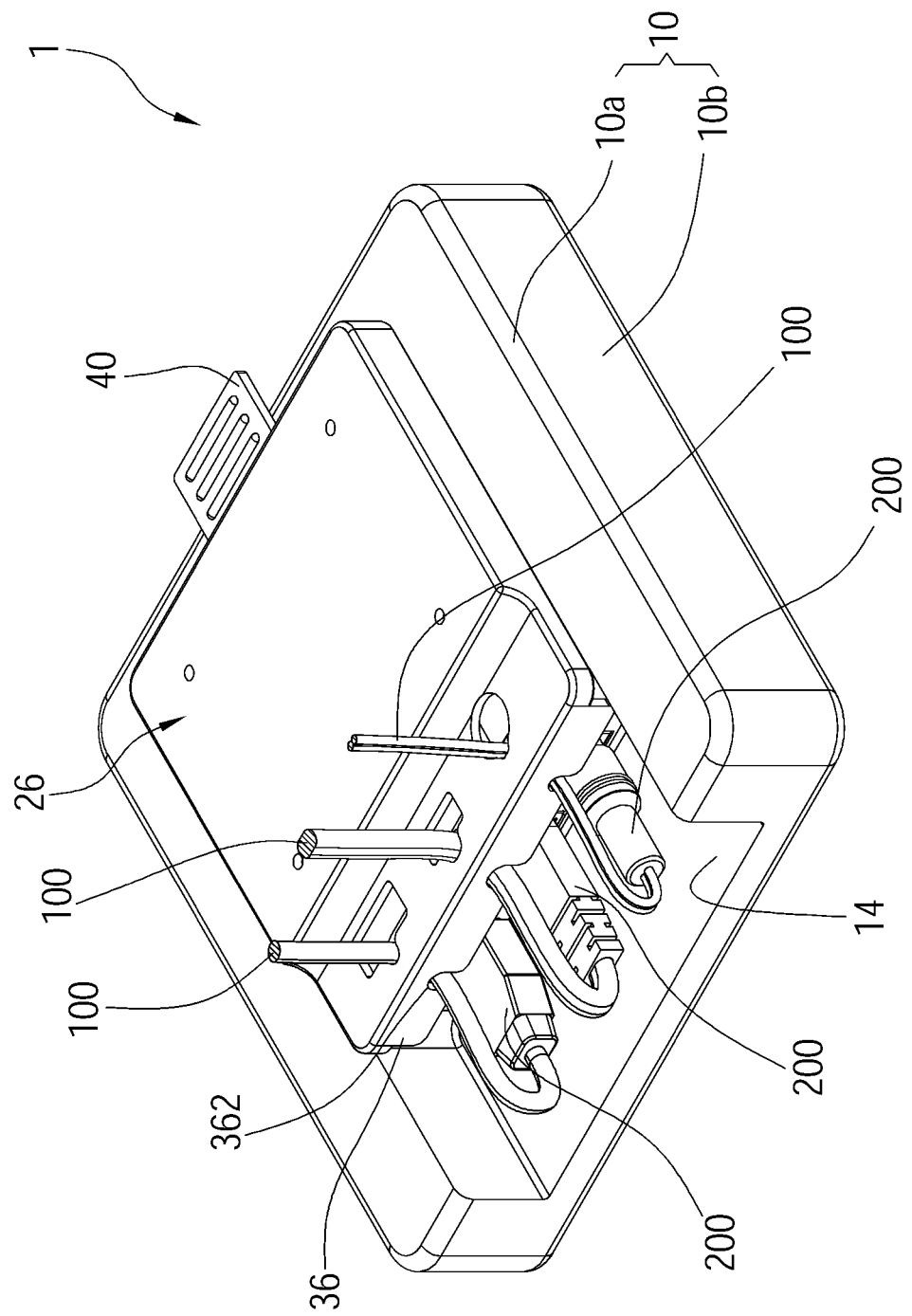
FIG. 1 is a perspective diagram, showing the electronic device of a first embodiment according to the present invention.

As illustrated in FIG. 1 to FIG. 7, an electronic device 1 of a first embodiment according to the present invention. In the current embodiment, a router is taken as an example of the electronic device 1. However, the electronic device 1 is not limited to the router, but could be any electronic device which is adapted to be connected to at least one cable 100, such as a set-top box, a wireless access point, and so on. The electronic device 1 includes a case 10 and a fixing frame 26.

An inside of the case 10 is adapted to be disposed with a circuit board (not shown). The case 10 has a surface 12 and a receiving groove 14 recessed into the surface 12, wherein the receiving groove 14 has a groove wall 142, and a plurality of ports 16 are disposed on the groove wall 142. In the current embodiment, the ports 16 are, but not limited to, in female type, and are electrically connected to the circuit board disposed inside the case 10. A side of the receiving groove 14 opposite to the groove wall 142 is open. The ports 16 are adapted to transmit a signal or electricity. In the current embodiment, a USB port, an Ethernet port, and a power port are taken as example of the ports 16, but the ports 16 are not limited by the exemplified above. The receiving groove 14 is adapted to receive a plurality of connectors 200, wherein each of the connectors 200 is correspondingly connected to one of the ports 16 and is connected to an end of the cables 100. In the current embodiment, each of the connector 200 is, but not limited to, in male type. In practice, a number of the port 16, a number of cables 100, and a number of the connector 200 could be one. In an embodiment, the cables 100 are not limited to be electronically connected to the circuit board inside the case 10 via the connectors 200 and the ports 16 (i.e. the cables 100 could pass through a perforation (not shown) of the case 10 to be electrically connected to the circuit board inside the case 10.)

The case 10 has a restricting board 18 located on a top portion of the receiving groove 14, wherein the restricting board 18 has at least one first restricting portion. In the current embodiment, the first restricting portion is exemplified by at least one restricting notch 182. In the current embodiment, a plurality of restricting notches 182 located nearby the ports 16, wherein each of the restricting notches is located above each of the ports 16.

A positioning slot 20 is disposed on the surface 12 of the case 10 and is recessed into the surface 12 to constitute a first positioning portion. Besides, the case 10 has two guiding grooves 22 which constitute a first guiding portion. In practice, a number of the guiding grooves 22 could be at least one. The guiding grooves 22 have the same structure, so that one of the guiding grooves 22 is taken for explaining hereinafter.

Figure 2:
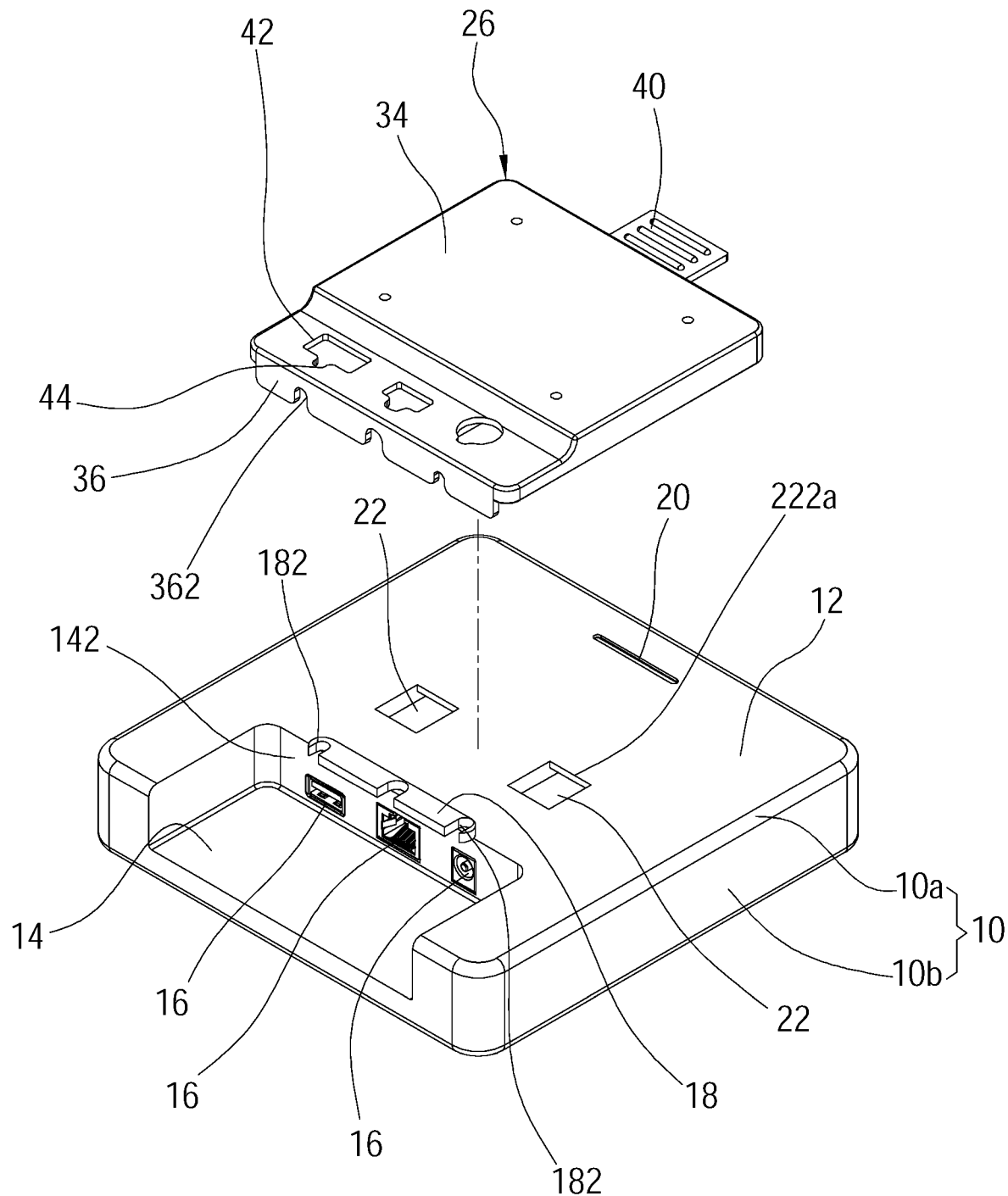
FIG. 2 is an exploded diagram of the electronic device of the first embodiment.
Figure 3:
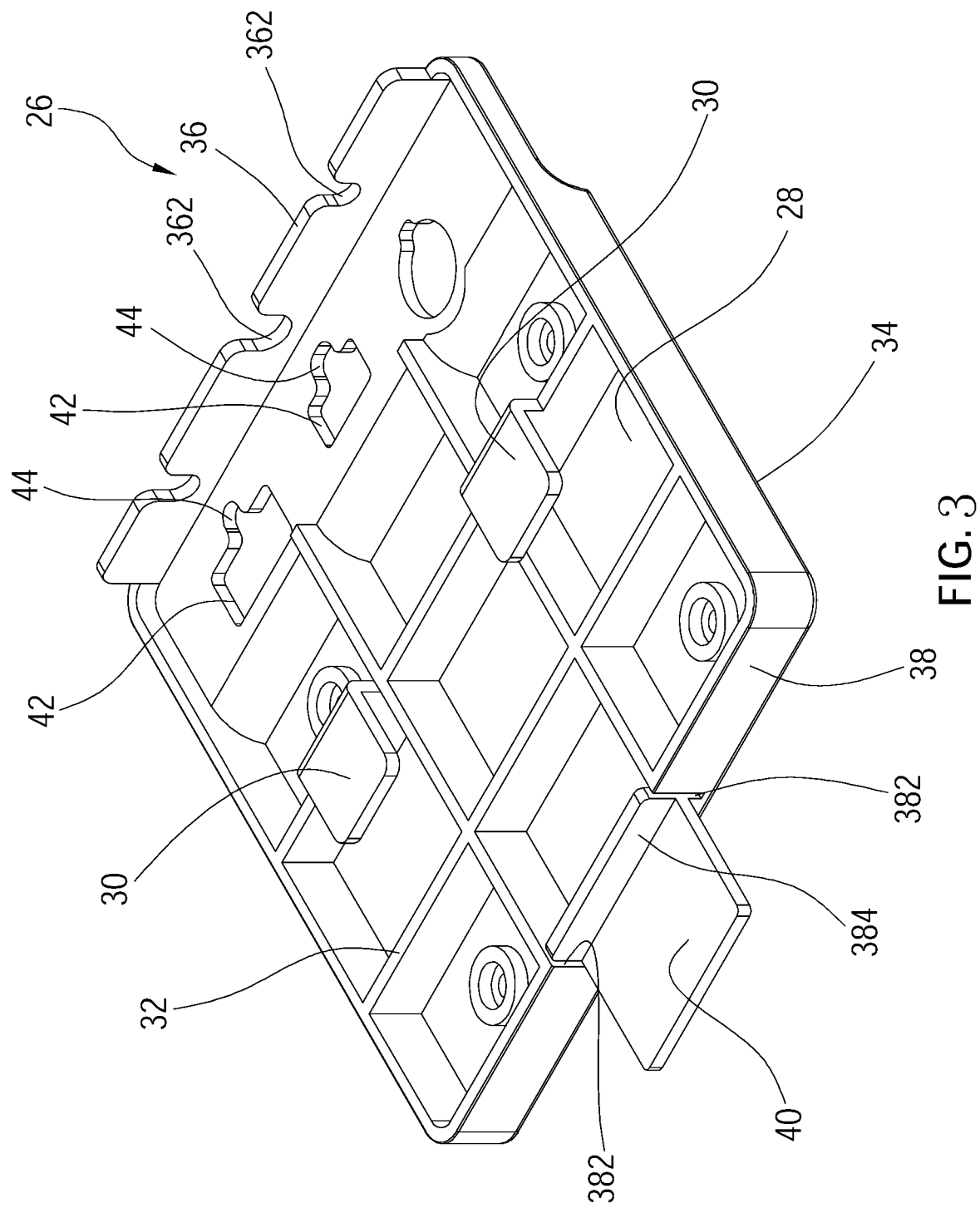
FIG. 3 is a perspective diagram, showing the fixing frame of the first embodiment.
Figure 5:
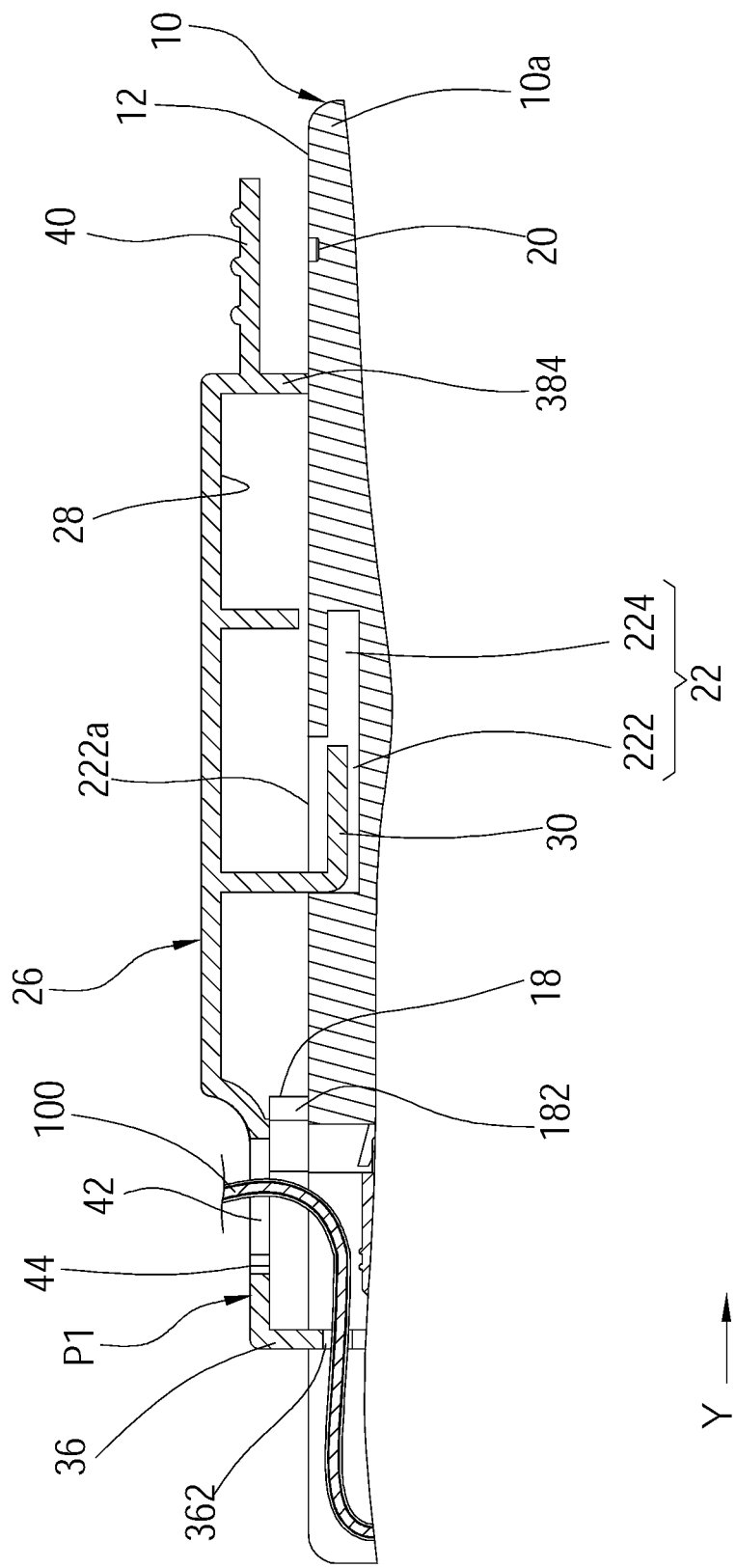
FIG. 5 is a partially sectional view taken along the 5-5 line in FIG. 4.

Referring to FIG. 2 and FIG. 5, the guiding groove 22 includes a first section 222 and a second section 224 which communicates with the first section 222. The first section 222 is recessed into the surface 12 of the case 10 and has an opening 222a on the surface 12. The second section 224 is located inside the case 10, and the first section 222 is located between the second section 224 and the restricting board 18.

The fixing frame 26 is detachably connected to the case 10 and has a first surface 28 and a second surface 34 which face opposite directions, and has a first sidewall 36 and a second sidewall 38 which face opposite directions. The first surface 28 faces the surface 12 of the case 10. Two guiding boards 30 and a plurality of ribs are disposed on the first surface 28, wherein each of the guiding boards 30 extends in a direction from the first sidewall 36 to the second sidewall 38. The guiding boards 30 constitute a second guiding portion. Each of the guiding boards 30 is detachably engaged with one of the guiding grooves 22 of the first guiding portion on the case 10. In practice, a number of the guiding boards 30 could be at least one. A plurality of fixing notches 362 is disposed on the first sidewall 36 and is adapted to fix the cables 100. The second sidewall 38 has two cutting slots 382 and a positioning board 384 located between the two cutting slots 382, wherein the positioning board 384 constitutes a second positioning portion. A bottom end of the positioning board 384 protrudes over a bottom end of the rest portion of the second sidewall 38. The fixing frame 26 further includes a protruding tab 40 connected to the positioning board 384, wherein the protruding tab 40 could be poked by an external force, so that the positioning board 384 could be slightly and elastically deformed.

Figure 4:
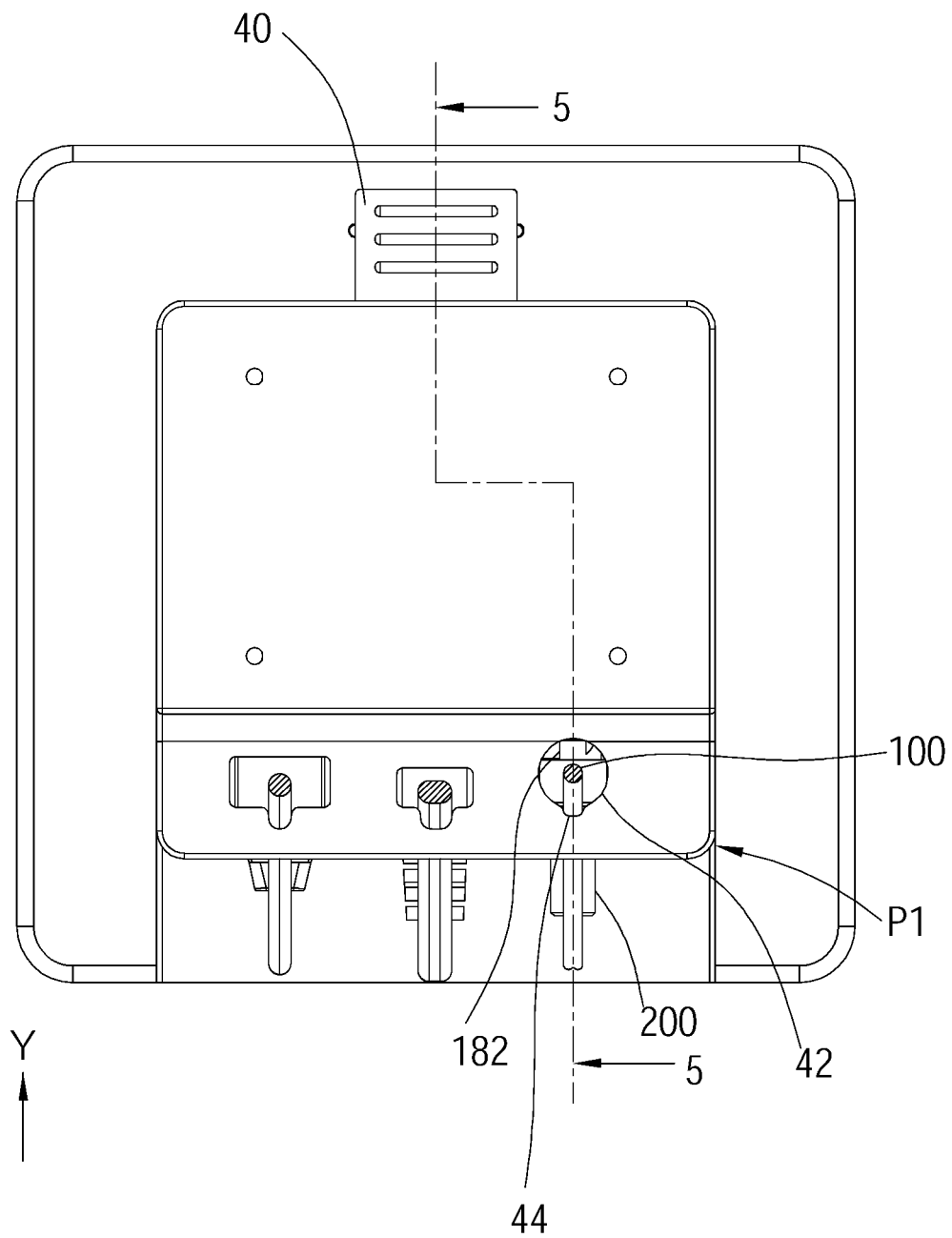
FIG. 4 is a schematic diagram, showing a top view of the electronic device and the fixing frame of the first embodiment in the first position.
Figure 6:
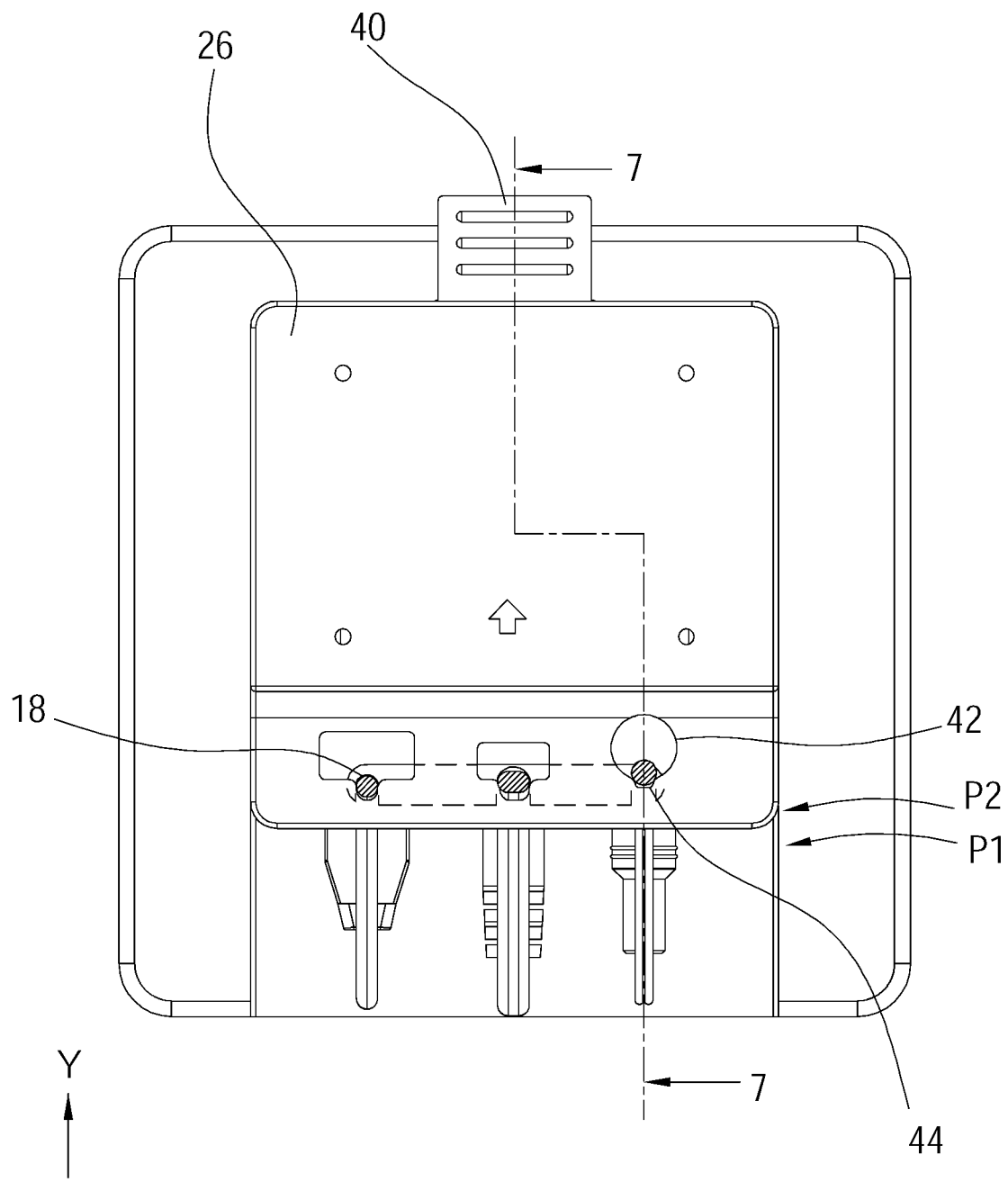
FIG. 6 is a schematic diagram, showing a top view of the electronic device and the fixing frame of the first embodiment in the second position.

The fixing frame 26 is movable relative to the case 10 in an axial direction Y between a first position P1 as shown in FIG. 4 and a second position P2 as shown in FIG. 6.

The fixing frame 26 has a plurality of through holes 42 and a plurality of recessing notches 44, wherein the through holes 42 and the recessing notches 44 penetrate through the first surface 28 and the second surface 34. Each of the recessing notches 44 is located on a peripheral edge of one of the through holes 42 and communicates with the corresponding through hole 42. The through holes 42 constitute a plurality of hollow portion, and the recessing notches 44 constitute a plurality of second restricting portions. Each recessing notches 44 corresponds to one of the fixing notches 362. Each of the through holes 42 is adapted to be passed through by one of the cables 100. In the current embodiment, a shape of each of the through holes 42 corresponds with a shape of one of the connectors 200, and each of the through hole 42 is slightly greater than the corresponding connector 200, so that each of the connectors 200 could be inserted through one of the through holes 42, thereby to draw the corresponding cable 100 through one of the through holes 42. In practice, a number of the recessing notches 44, a number of the through holes 42, and a number of the fixing notches 362 could be one.

Before using the electronic device 1, both of the connectors 200 and the cables 100 are passed through the through holes 42, and then the connectors 200 are correspondingly inserted into the ports 16 to be located in the receiving groove 14. As shown in FIG. 4 and FIG. 5, the fixing frame 26 is mounted on the surface 12 of the case 10, and the fixing frame 26 is in the first position P1. At this time, each of the guiding boards 30 is inserted into the first section 222 of one of the guiding grooves 22 from the opening 222a on the surface 12 of the case 10. Each of the recessing notches 44 corresponds to one of the restricting notches 182 and is away from one of the restricting notches 182 in the axial direction Y. Each of the cables 100 is located between one of the recessing notches 44 and the corresponding restricting notch 182. A portion of each of the cables 100 is located in the fixing notches 362 of the first sidewall 36 to enhance a regularity of an arrangement of the cables 100.

Figure 7:
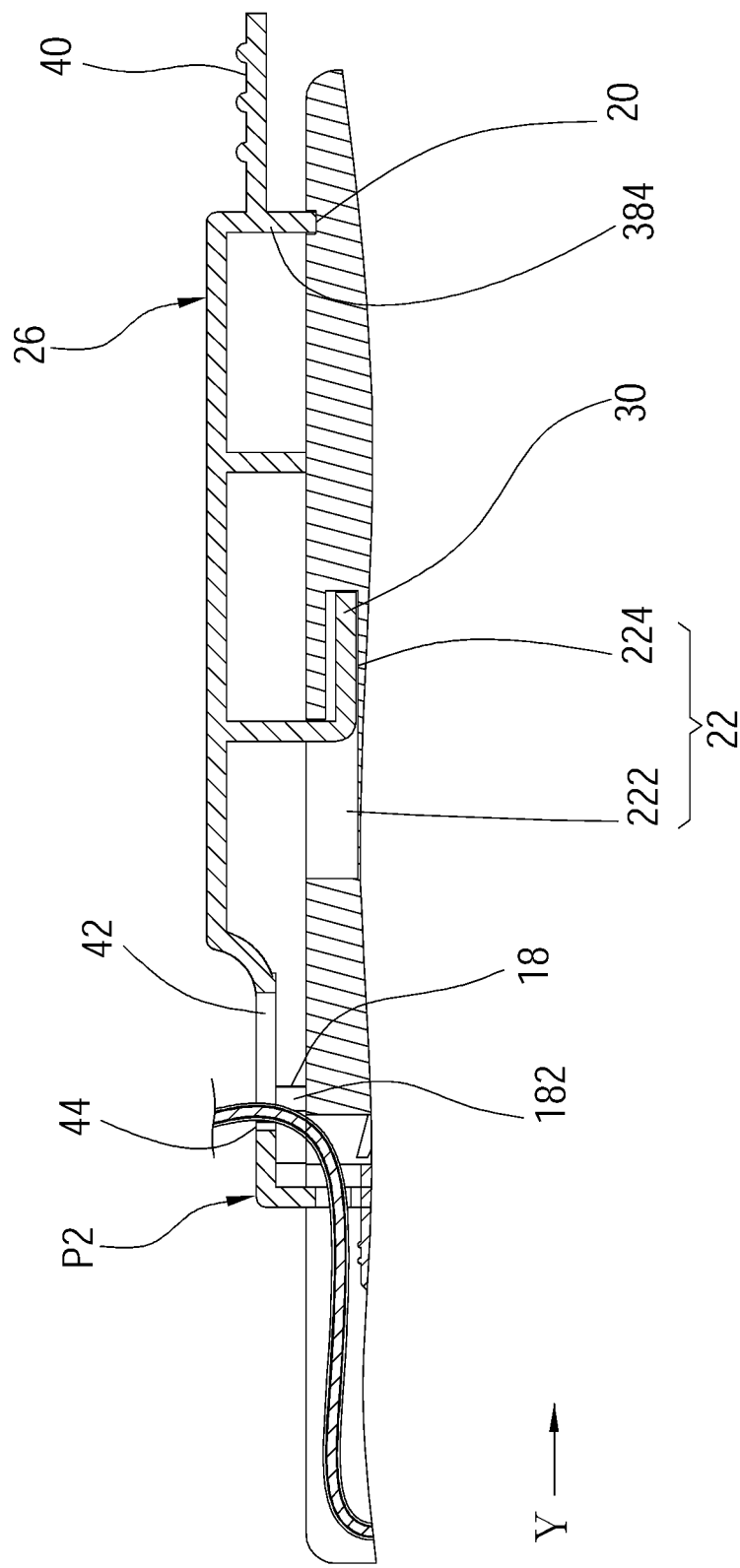
FIG. 7 is a partially sectional view taken along the 7-7 line in FIG. 6.

Referring to FIG. 6 and FIG. 7, the fixing frame 26 is pushed to move toward the second position P2 in the axial direction Y. During the moving process, each of the guiding boards 30 of the fixing frame 26 is moved along one of the guiding grooves 22 of the case 10. When the fixing frame 26 is moved to the second position P2, each of the guiding boards 30 is located in one of the second sections 224, and the positioning board 384 is engaged with the positioning slot 20. In other words, the second positioning portion of the fixing frame 26 is engaged with the first positioning portion of the case 10, thereby to avoid the fixing frame 26 moving away from the second position P2. Moreover, each of the recessing notches 44 approaches one of the restricting notches 182 in the axial direction Y, so that each of the cables 100 is located and is restricted between one of the recessing notches 44 and the corresponding restricting notch 182, thereby each of the recessing notches 44 and one of the restricting notches 182 jointly restrict a position of the cables 100 to neatly arrange the cables 100 on a side of the case 10.

On the contrary, when the fixing frame 26 is about to be disengaged from the case 10, the protruding tab 40 is poked by an external force in a direction from the first surface 28 to the second surface 34 to make the bottom end of the positioning board 384 being disengaged from the positioning slot 20, so that the fixing frame 26 could be moved toward the first position P1. After that, by simply removing the guiding boards 30 from the guiding grooves 22, the fixing frame 26 could be disengaged from the case 10.

In practice, the case 10 and the fixing frame 26 could be positioned not only by engaging the positioning board 384 and the positioning slot 20, but also by a tight fit between a groove wall of the second section 224 of at least one of the guiding grooves 22 and at least one of the guiding boards 30. Thus, the positioning board 384 and the positioning slot 20 could be optionally disposed.

In view of the above, in the current embodiment, the case 10 is divided into an engaging portion 10a and a base 10b, wherein the engaging portion 10a is connected to the base 10b. The engaging portion 10a is adapted to be engaged with the fixing frame 26. The engaging portion 10a and the fixing frame 26 jointly restrict the position of the cables 100. The base 10b is disposed with the ports 16 and the inside circuit board. In the current embodiment, the engaging portion 10a and the base 10b are, but not limited to, integrally formed as a monolithic unit. In another embodiment, the engaging portion 10a and the base 10b could be two detachable components as well.

Figure 8:
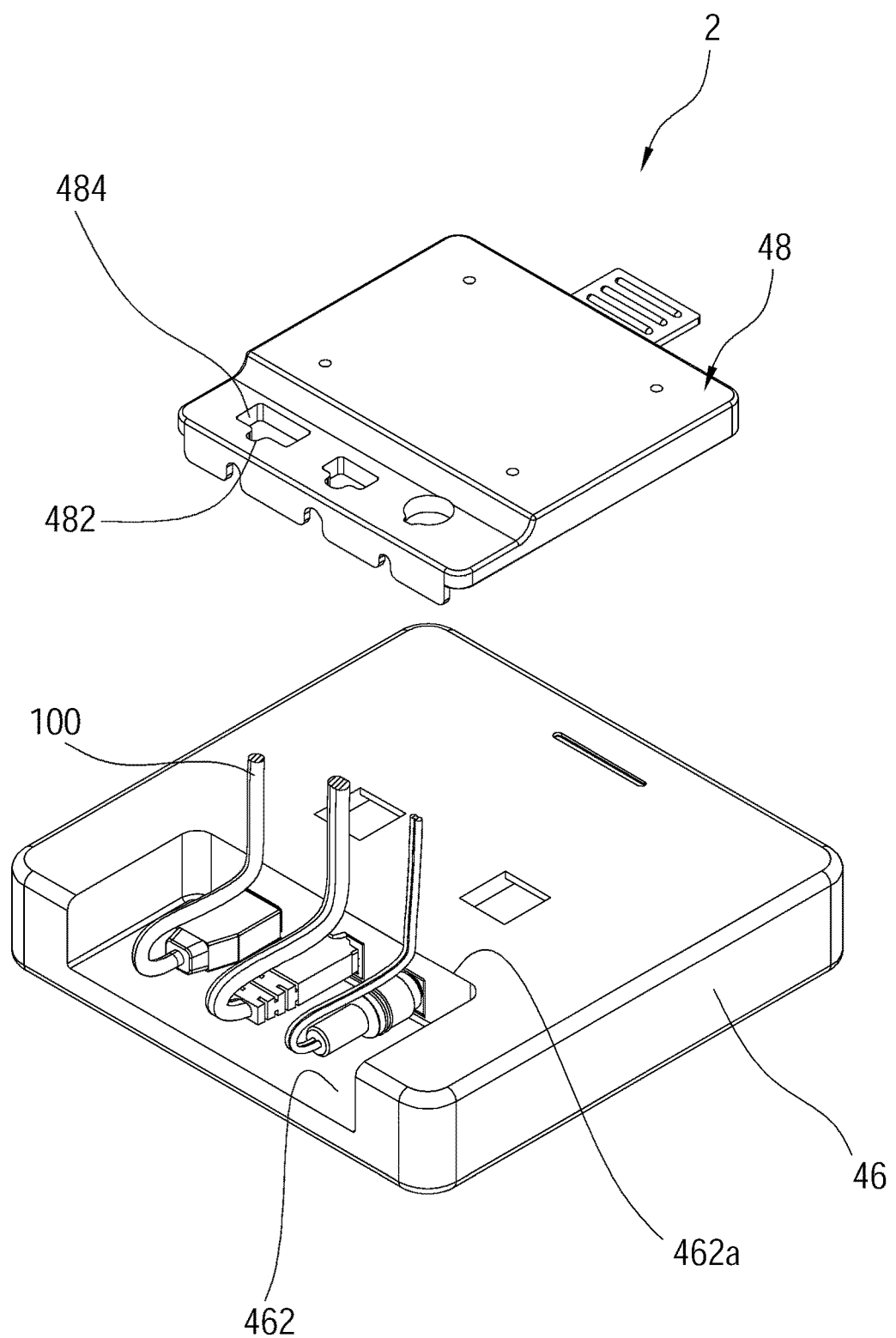
FIG. 8 is an exploded diagram of the electronic device of a second embodiment according to the present invention.
Figure 9:
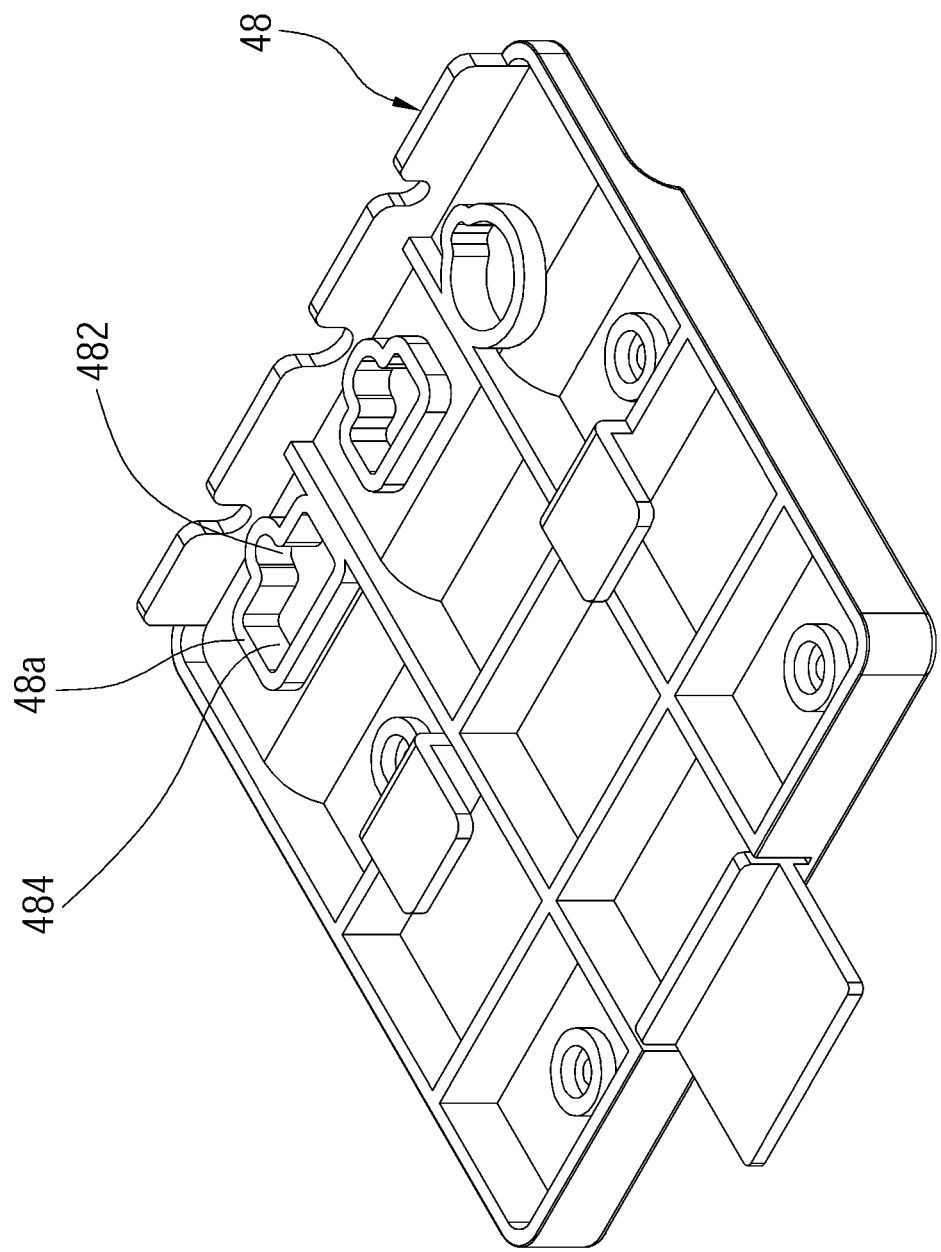
FIG. 9 is a perspective diagram, showing the fixing frame of the second embodiment.

As illustrated in FIG. 8 and FIG. 9, an electronic device 2 of a second embodiment according to the present invention has almost the same structure as that of the first embodiment, except that a top portion of a receiving groove 462 of a case 46 does not provide with the restricting board 18 and the restricting notches 182 in the first embodiment. In the current embodiment, the first restricting portion is constituted by an edge 462a of the top portion of the receiving groove 462 corresponding to recessing notches 482 of a fixing frame 48. In other words, when the fixing frame 48 is located in the second position P2, the cables 100 are located in the recessing notches 482 and are located between the recessing notches 482 and the edge 462a of the top portion of the receiving groove 462, so that the edge 462a of the case 46 and the recessing notches 482 jointly restrict the position of the cables 100. Additionally, in the current embodiment, a peripheral edge of through holes 484 and a peripheral edge of recessing notches 482 further extend downward to jointly form a flange 48a to enhance a structural strength of the through holes 484 and the recessing notches 482.

As shown in FIG. 10 to FIG. 13, an electronic device 3 of a third embodiment according to the present invention is similar to that of the first embodiment, and the differences between the electronic device 3 of the third embodiment and that of the first embodiment are described as follow. Two guiding grooves 52 of a case 50 are arc-shaped, and a first section 522 of each of guiding grooves 52 has an arc-shaped opening 522a. A fixing frame 58 is in a circular plate shape, wherein each of guiding boards 60 is disposed on a first surface 582 of the fixing frame 58 corresponding to each guiding grooves 52. The guiding boards 60 mounted on the first surface 582 are arc-shaped. Furthermore, the fixing frame 58 has a plurality of through holes 62 and a plurality of cable slots 64. Each of the through holes 62 correspondingly extends in an arc direction to form the hollow portion; each of the cable slots 64 is formed by recessing from a peripheral edge of the fixing frame 58 and communicates with one of the through holes 62. In the current embodiment, an end of each of the through holes 62 is a closed end 622, and another end thereof communicates with an end of one of the cable slots 64, wherein another end of each of the cable slots 64 is an open end 642 and communicates outside.

Figure 10:
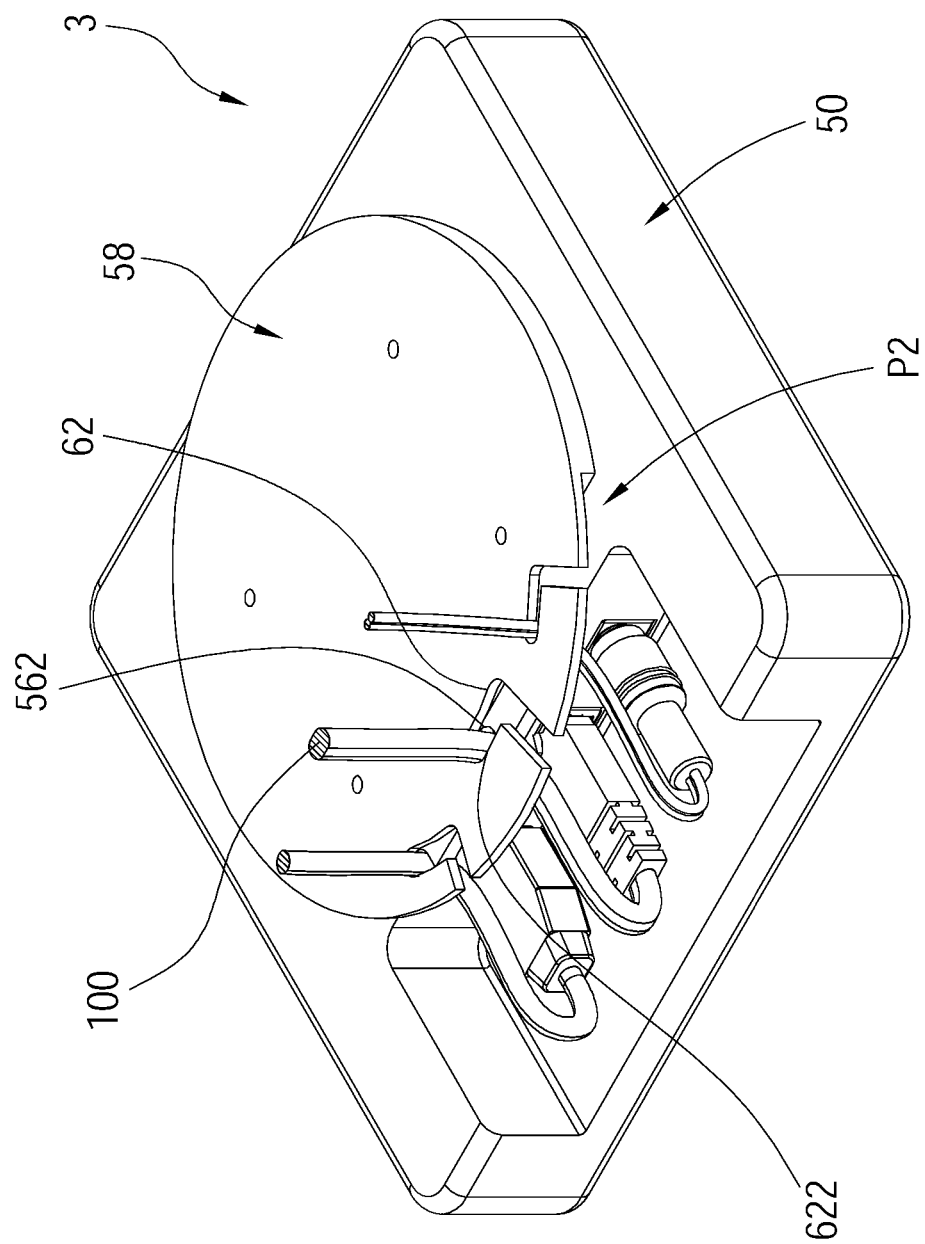
FIG. 10 is a perspective diagram, showing the electronic device of a third embodiment according to the present invention.
Figure 11:
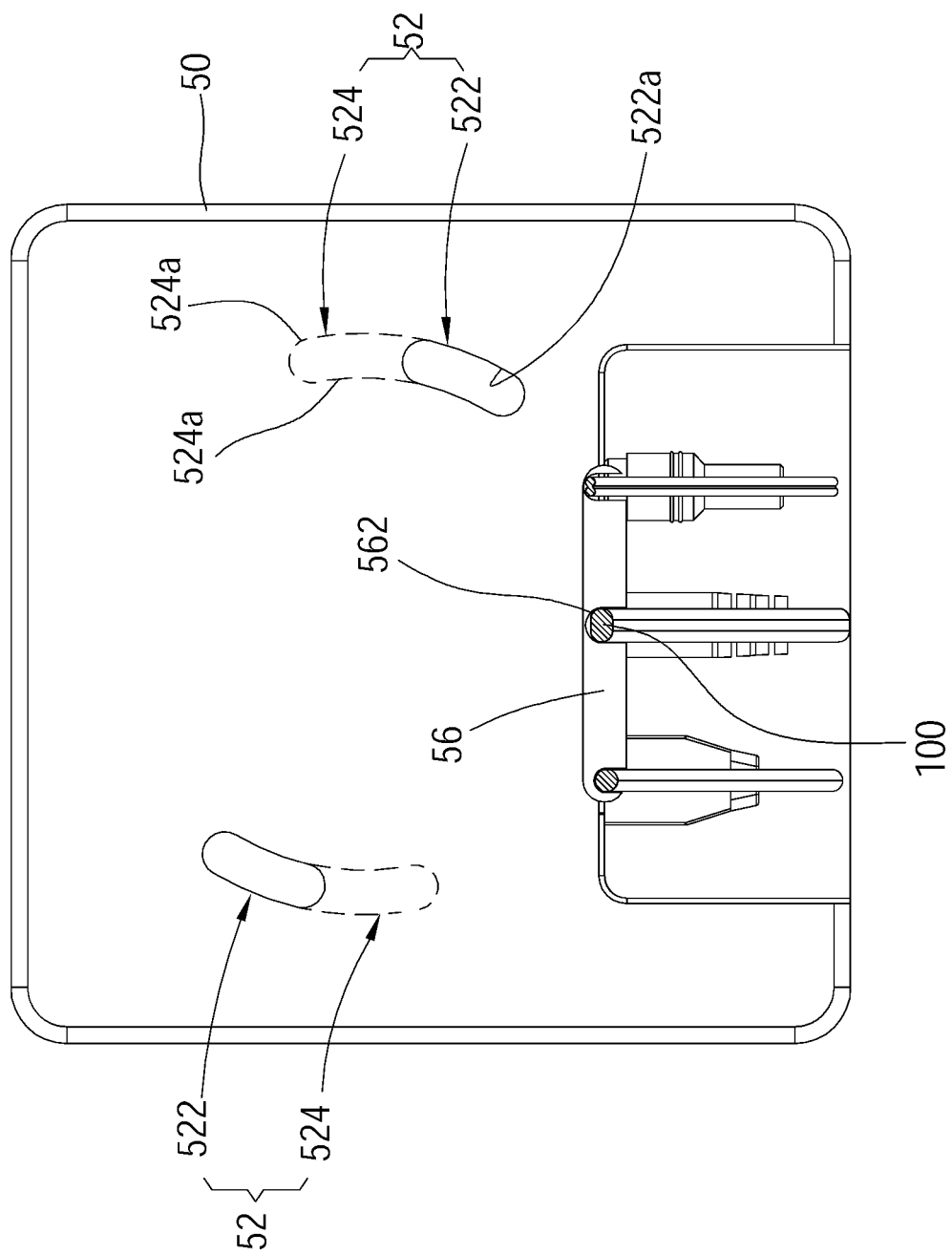
FIG. 11 is a schematic diagram, showing a top view of the case of the third embodiment.
Figure 12:
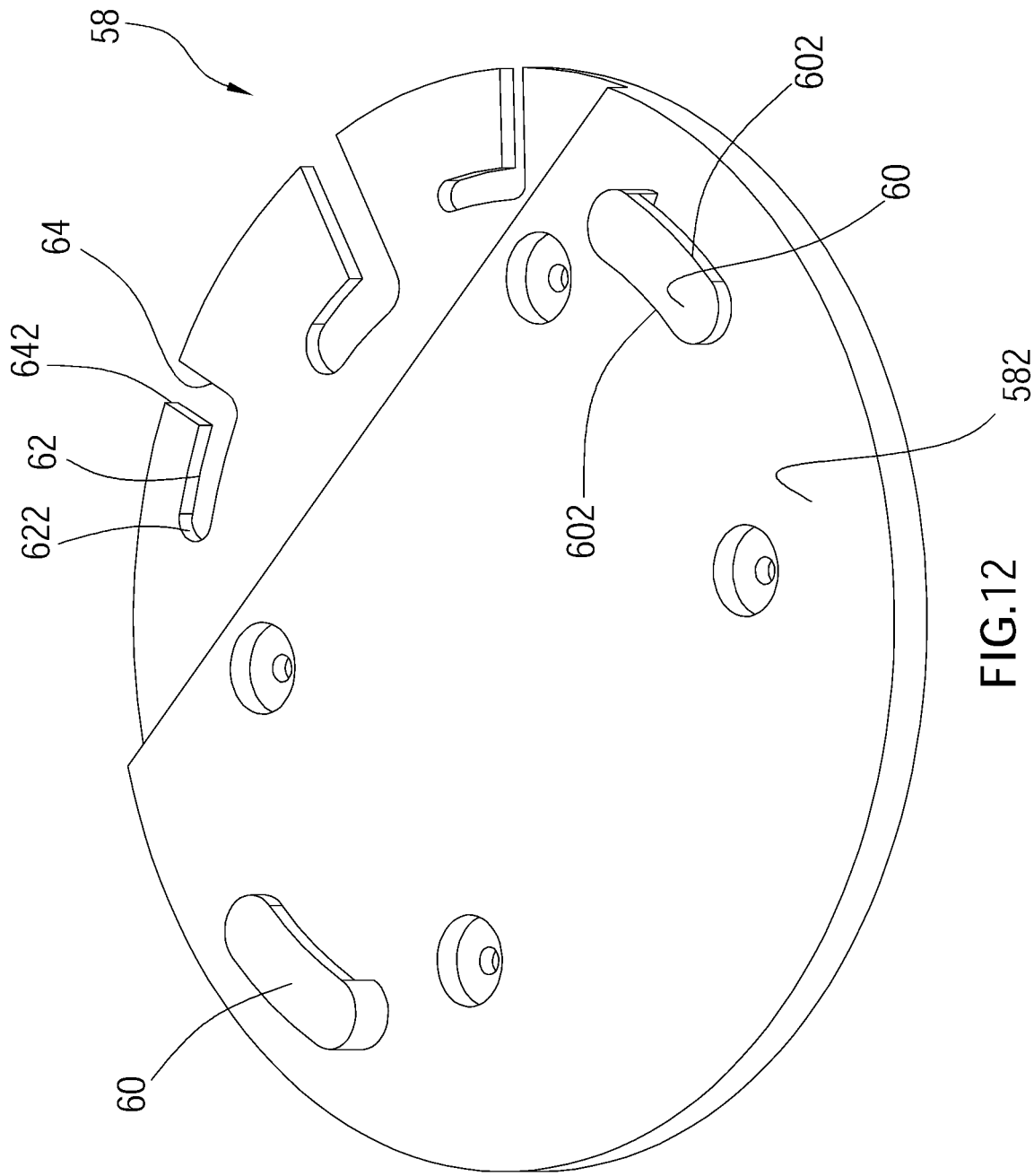
FIG. 12 is a perspective diagram, showing the fixing frame of the third embodiment.
Figure 13:
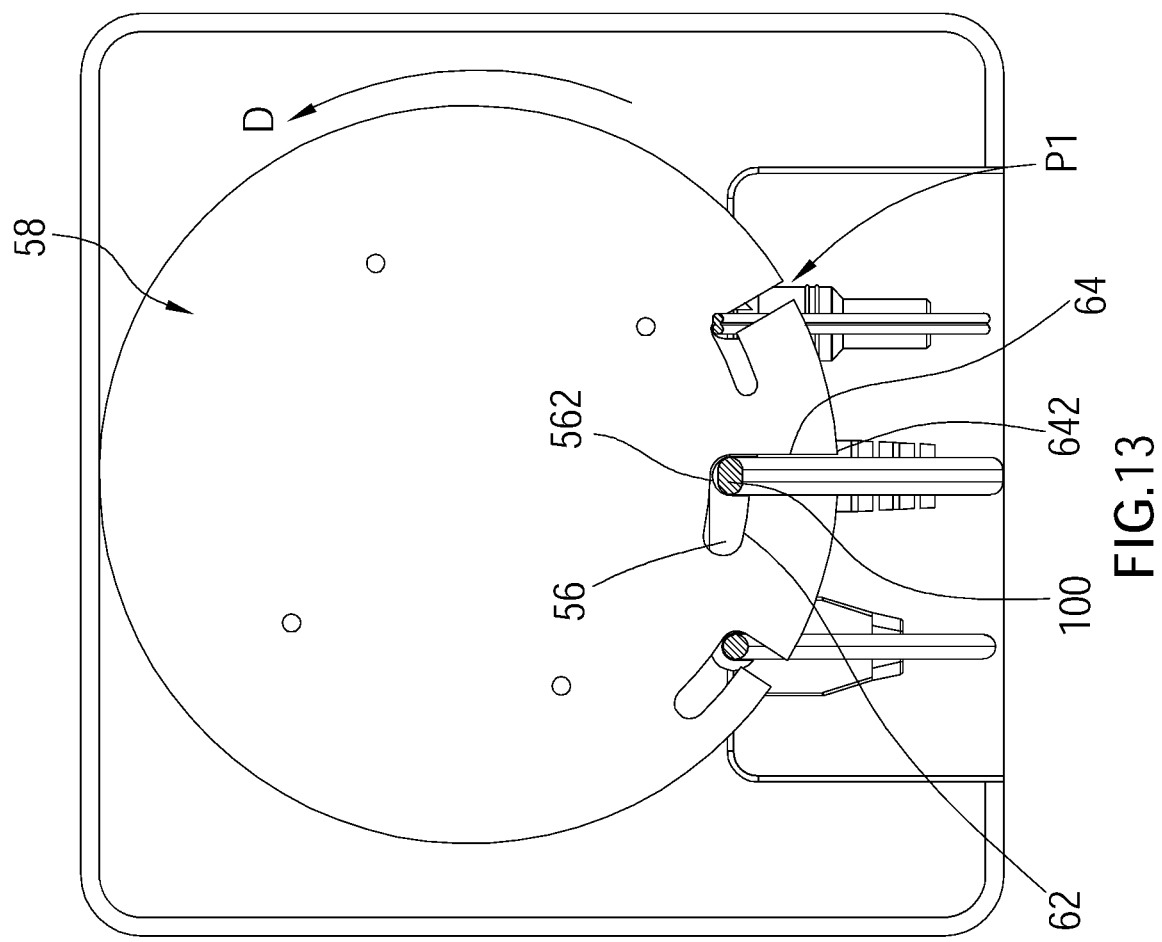
FIG. 13 is a schematic diagram, showing a top view of the electronic device and the fixing frame of the third embodiment in the first position.

As shown in FIG. 13, before using the electronic device 3, the fixing frame 58 is firstly put on the case 50 to be located in the first position P1. At this time, each of the guiding boards 60 is inserted into the first section 522 of one of the guiding grooves 52. Each of the cables 100 could be put into one of the cable slots 64 from the open end 642 of the corresponding cable slot 64, and then could be moved into restricting notches 562 of a restricting board 56, so that each of the cables 100 is located in one of the through holes 62. After that, the fixing frame 58 is rotated along a rotational direction D, so that each of the through holes 62 is moved relative to the cables 100. When the fixing frame 58 is moved to the second position P2 (as shown in FIG. 10), the cables 100 are located in the restricting notches 562, and a peripheral edge of each of the through holes 62 and one of the restricting notches 562 jointly restrict the position of the cables 100. In the current embodiment, the closed end 622 of each of the through holes 62 constitutes one of the second restricting portions, so that the closed ends 622 of the through holes 62 and the restricting notches 562 jointly restrict the position of the cables 100.

Furthermore, in the current embodiment, two side surfaces 602 of each of the guiding boards 60 is engaged with two side walls 524a of a second section 524 of one of the guiding grooves 52 in a form of tight fit. In other words, the side walls 524a of the second section 524 of each of the guiding grooves 52 constitute the first positioning portion; the side surfaces 602 of each of the guiding boards 60 constitute the second positioning portion. When the fixing frame 58 is located in the second position P2, the side walls 524a of each of the second section 524 is tightly fitted with the side surfaces 602 of one of the guiding boards 60. When the fixing frame 58 is about to be taken off, the guiding boards 60 could be disengaged from the second sections 524 by simply rotating the fixing frame 58 along a direction opposite to the rotational direction D, so that the fixing frame 58 could be taken off.

Figure 14:
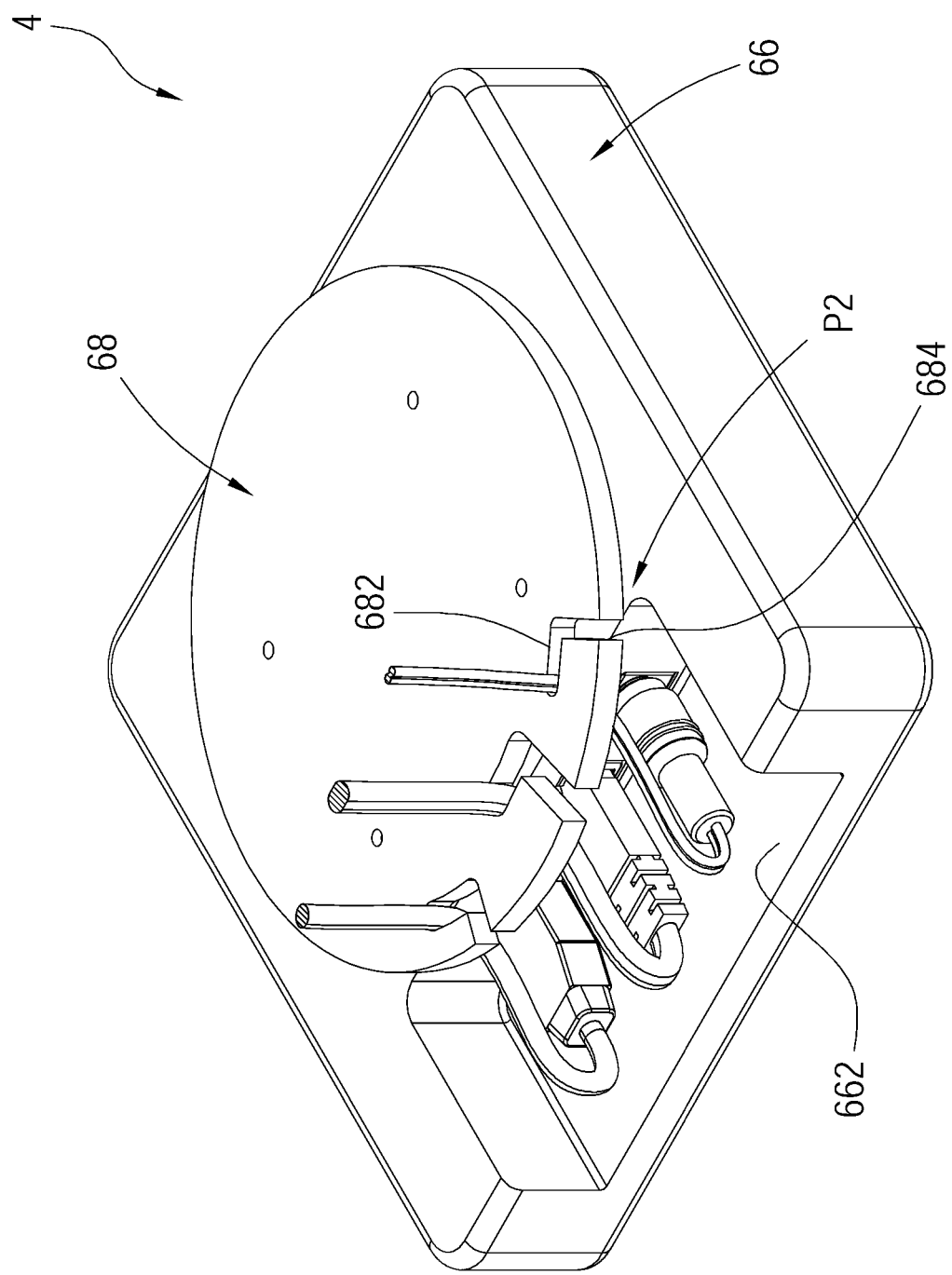
FIG. 14 is a perspective diagram, showing the electronic device of a fourth embodiment according to the present invention.
Figure 15:
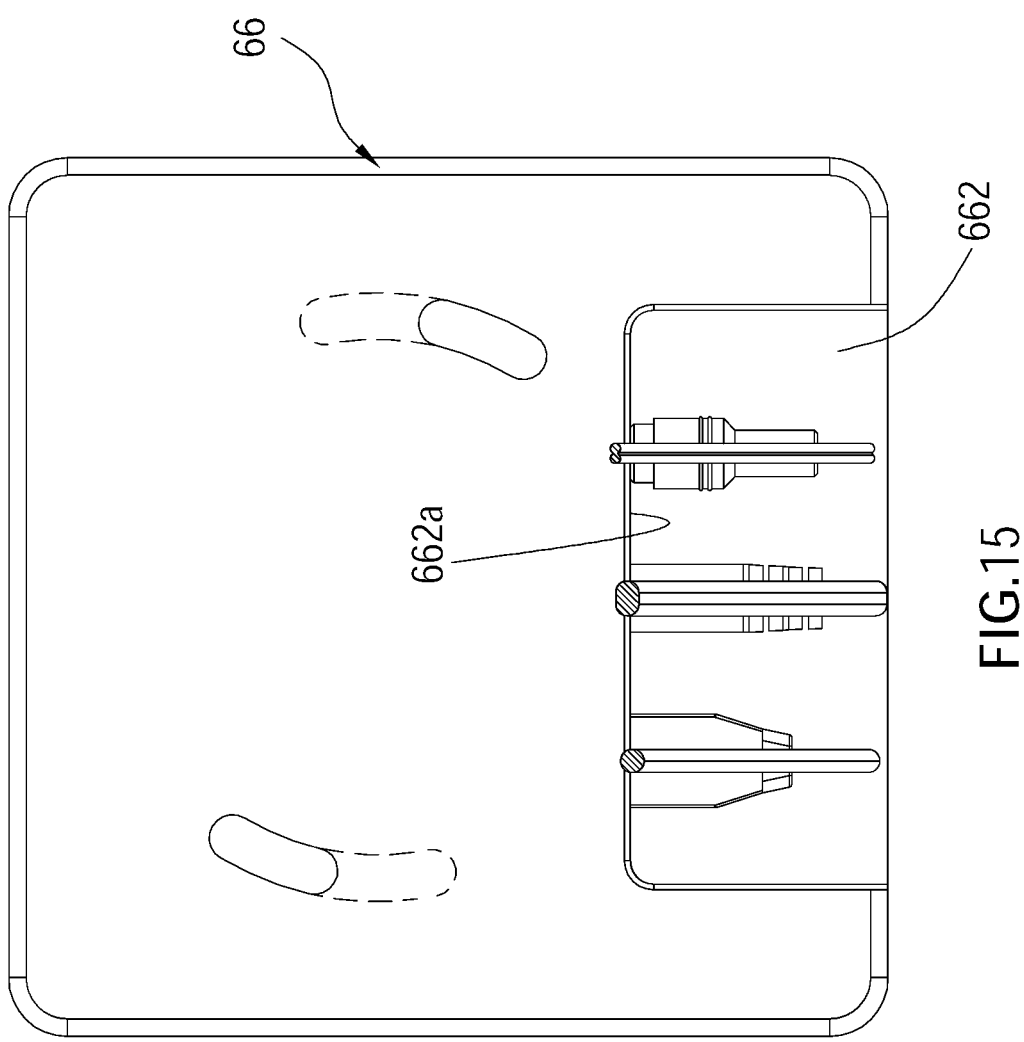
FIG. 15 is a schematic diagram, showing a top view of the case of the fourth embodiment.
Figure 16:
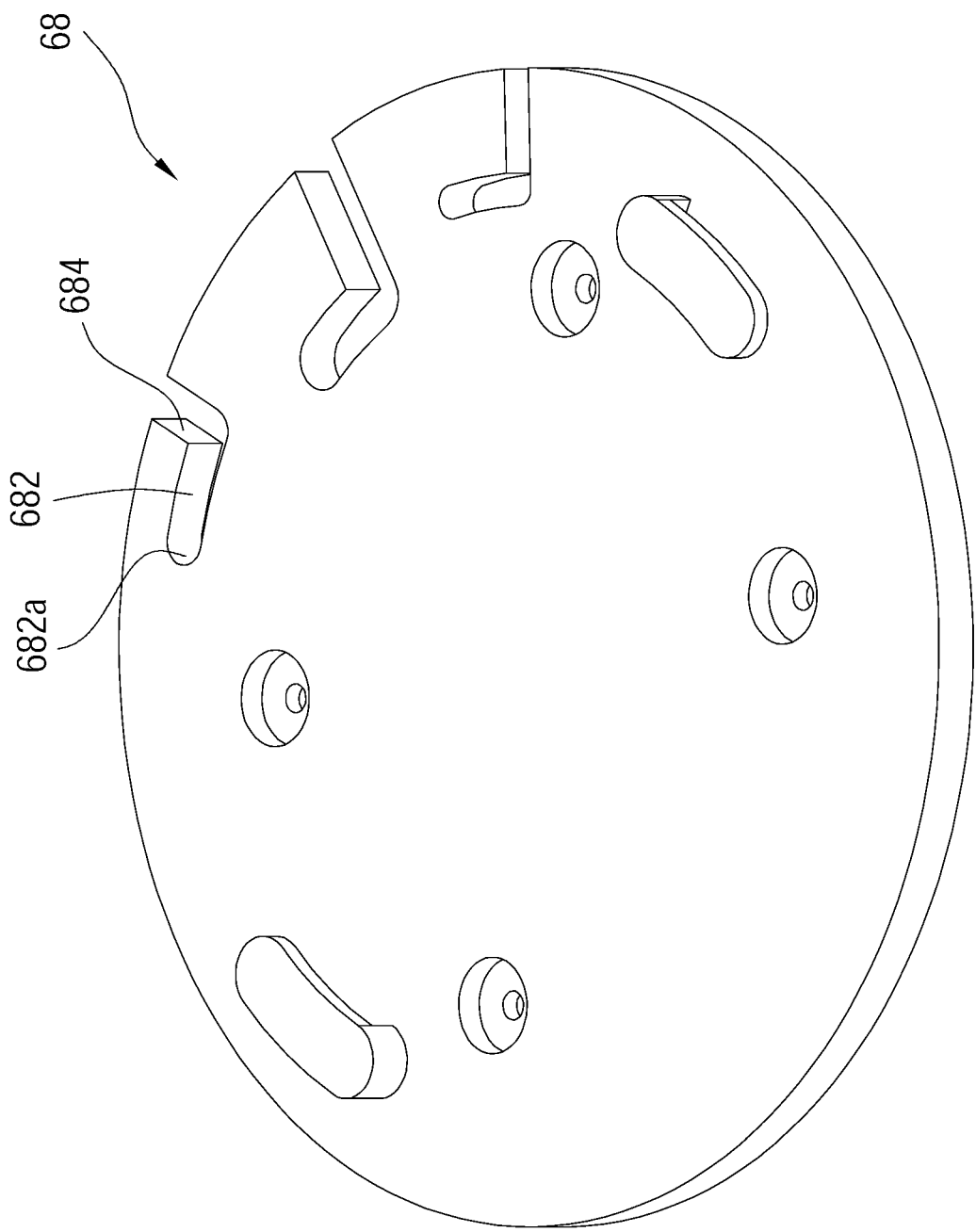
FIG. 16 is a perspective diagram, showing the fixing frame of the fourth embodiment.

As illustrated in FIG. 14 to FIG. 16, an electronic device 4 of a fourth embodiment according to the present invention has almost the same structure as that of the third embodiment, except that a top portion of a receiving groove 662 of a case 66 does not provide with the restricting board 56 and the restricting notches 562 in the third embodiment. In the current embodiment, the first restricting portion is constituted by an edge 662a of the top portion of the receiving groove 662. In other words, when a fixing frame 68 is located in the second position P2, a closed end 682a of the through holes 682 and the edge 662a of the case 66 jointly restrict the position of the cables 100. Additionally, in the current embodiment, a peripheral edge of the through holes 682 and the cable slots 684 is thicker than the fixing frame 58 of the third embodiment, thereby to enhance a structural strength of the through holes 682 and the cable slots 684.

Figure 17:
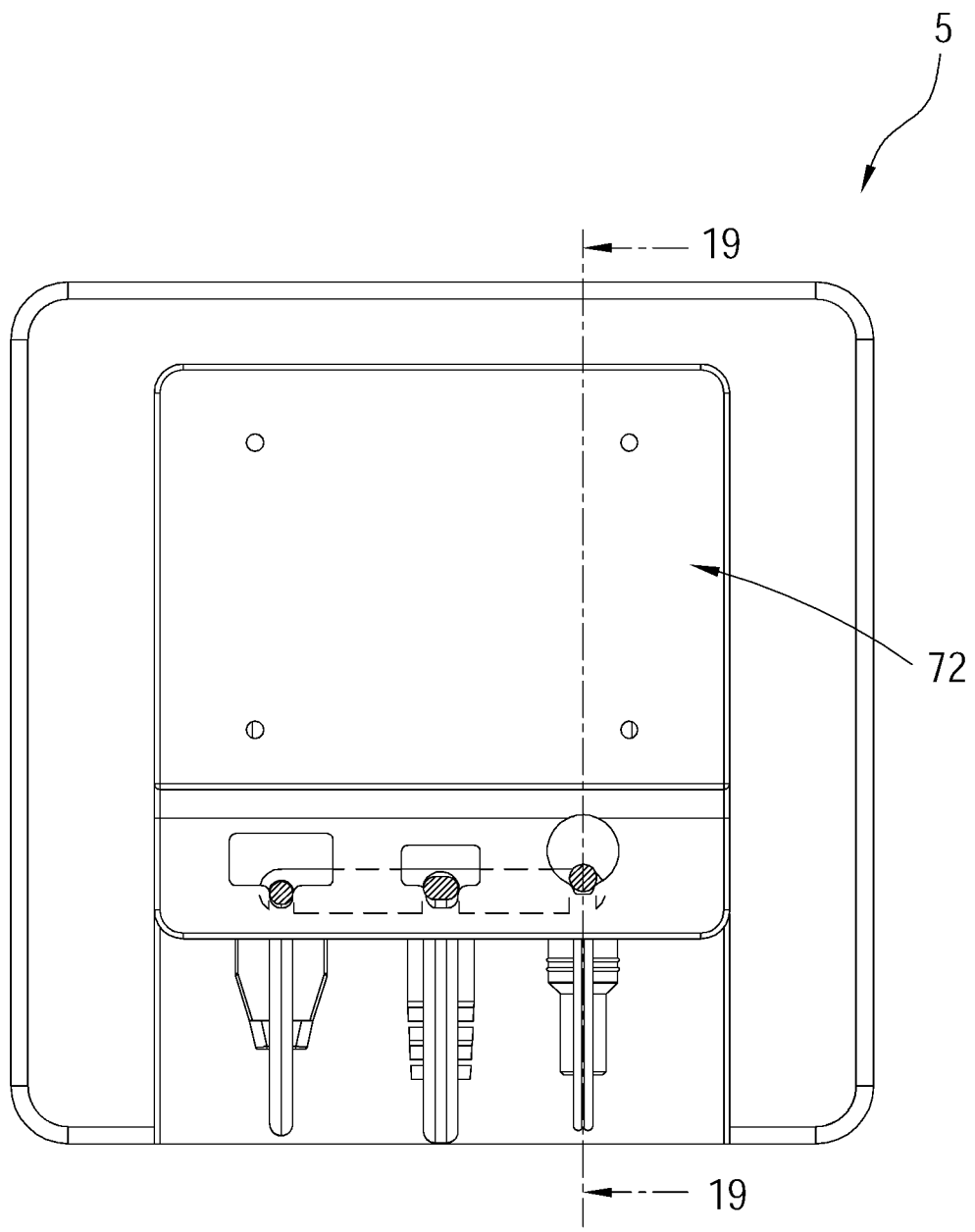
FIG. 17 is a schematic diagram, showing a top view of the electronic device of a fifth embodiment according to the present invention.
Figure 18:
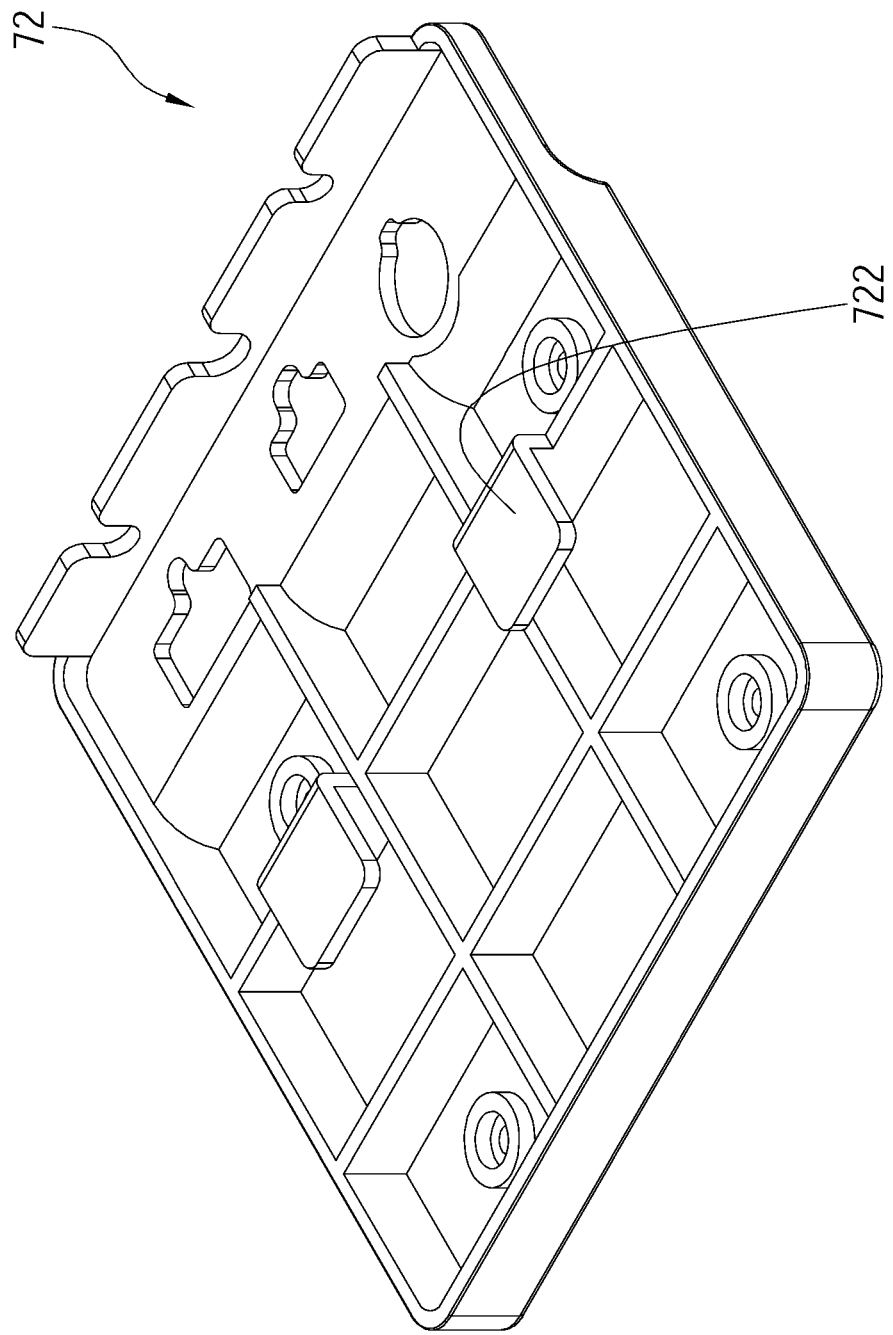
FIG. 18 is a perspective diagram, showing the fixing frame of the fifth embodiment.
Figure 19:
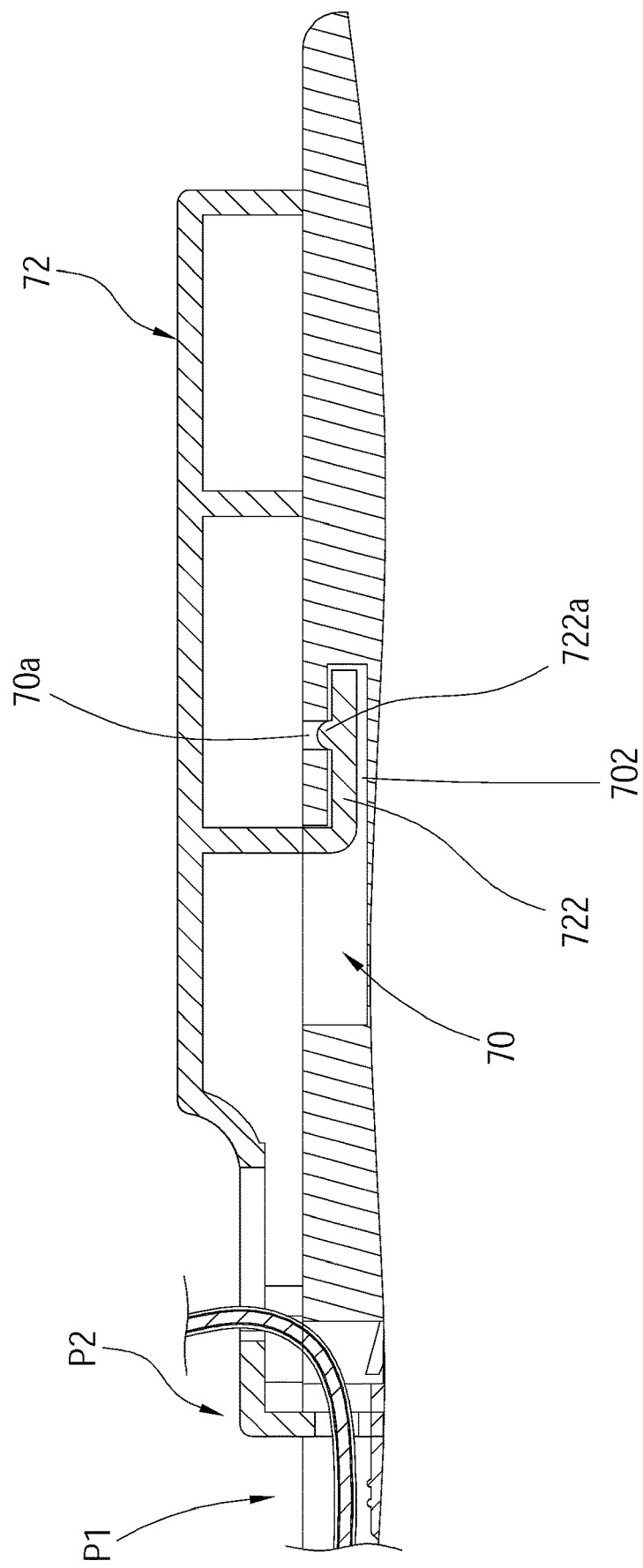
FIG. 19 is a partially sectional view taken along the 19-19 line in FIG. 17.
Figure 20:
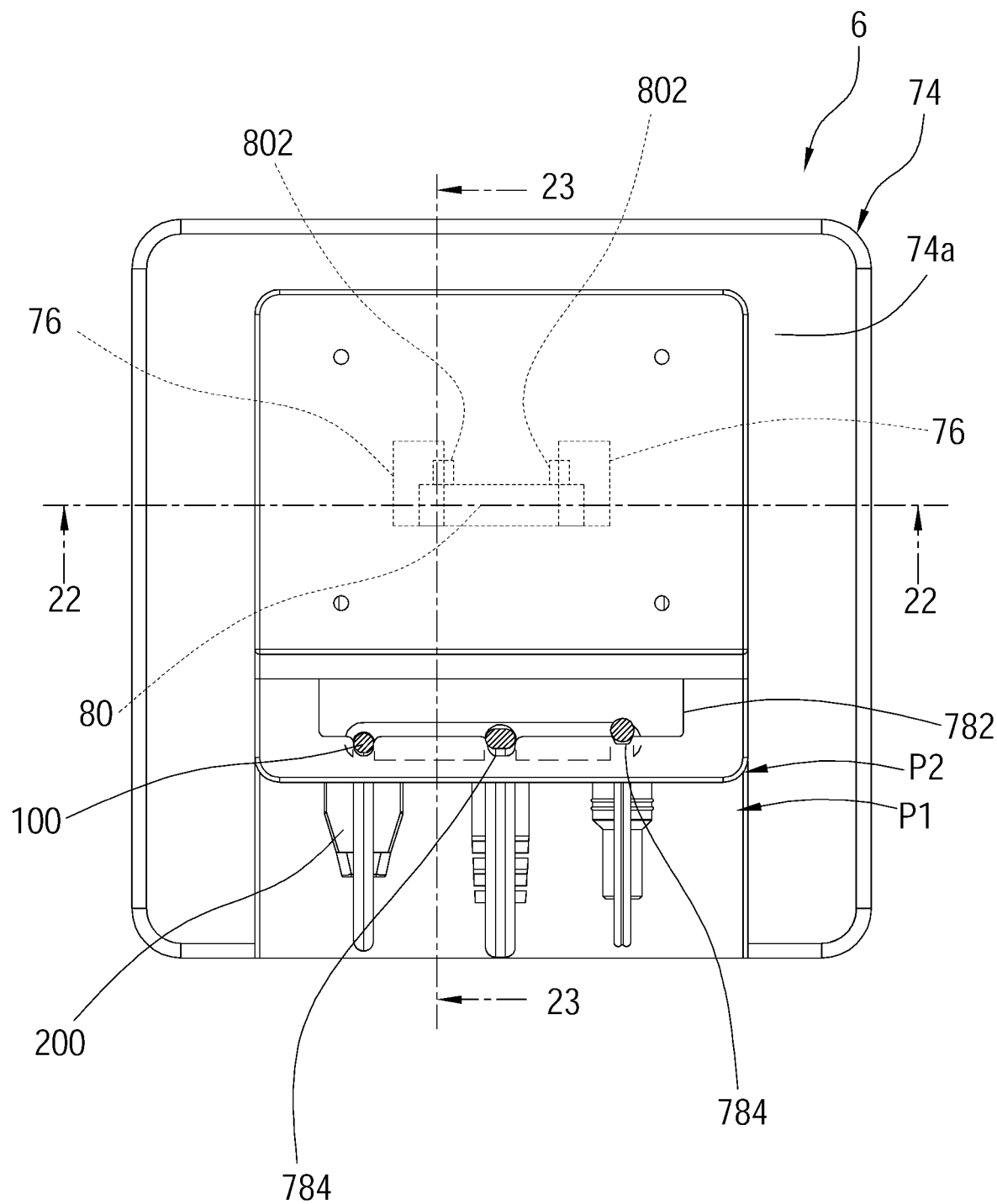
FIG. 20 is a schematic diagram, showing a top view of the electronic device of a sixth embodiment according to the present invention.
Figure 21:
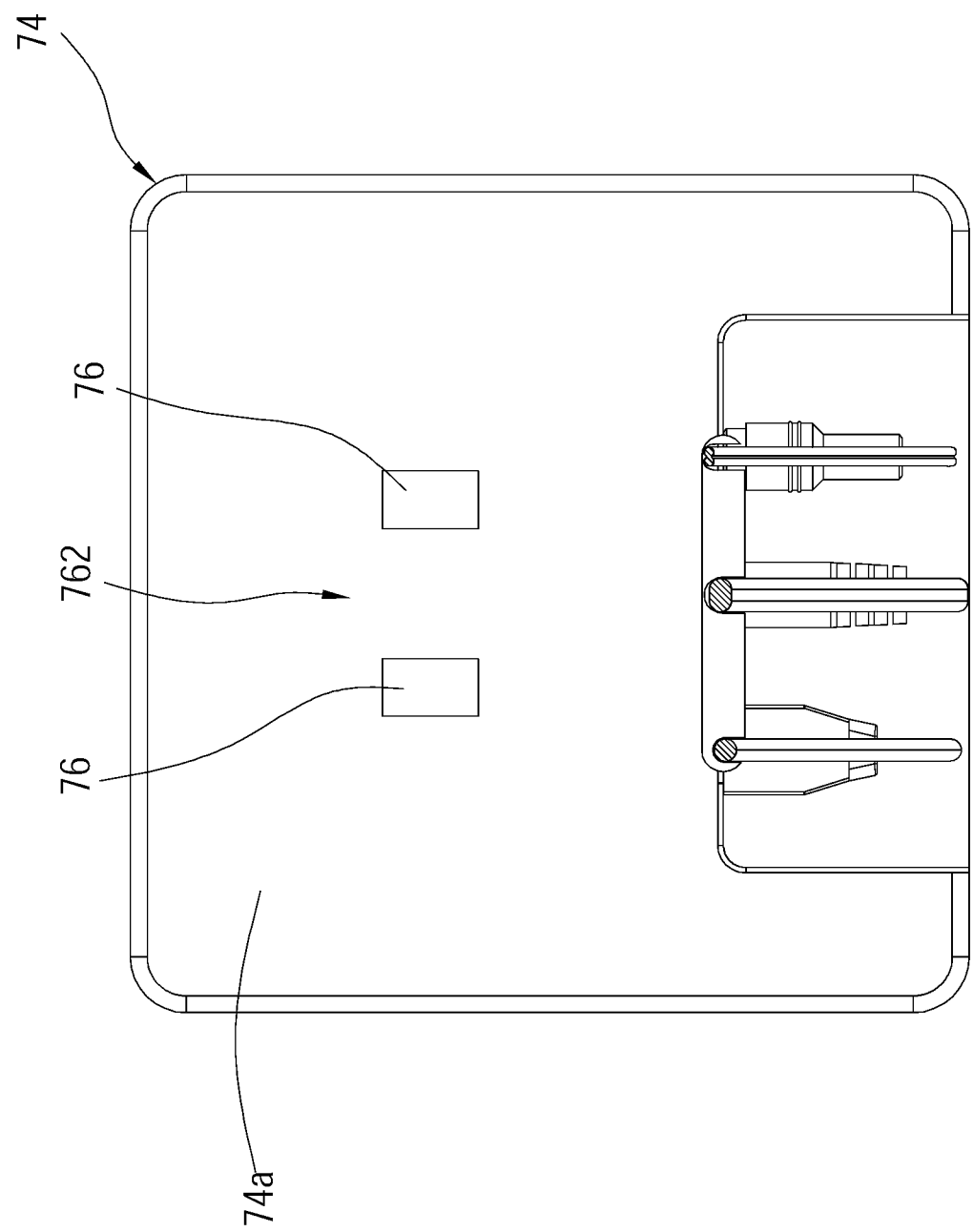
FIG. 21 is a schematic diagram, showing a top view of the case of the sixth embodiment.
Figure 22:
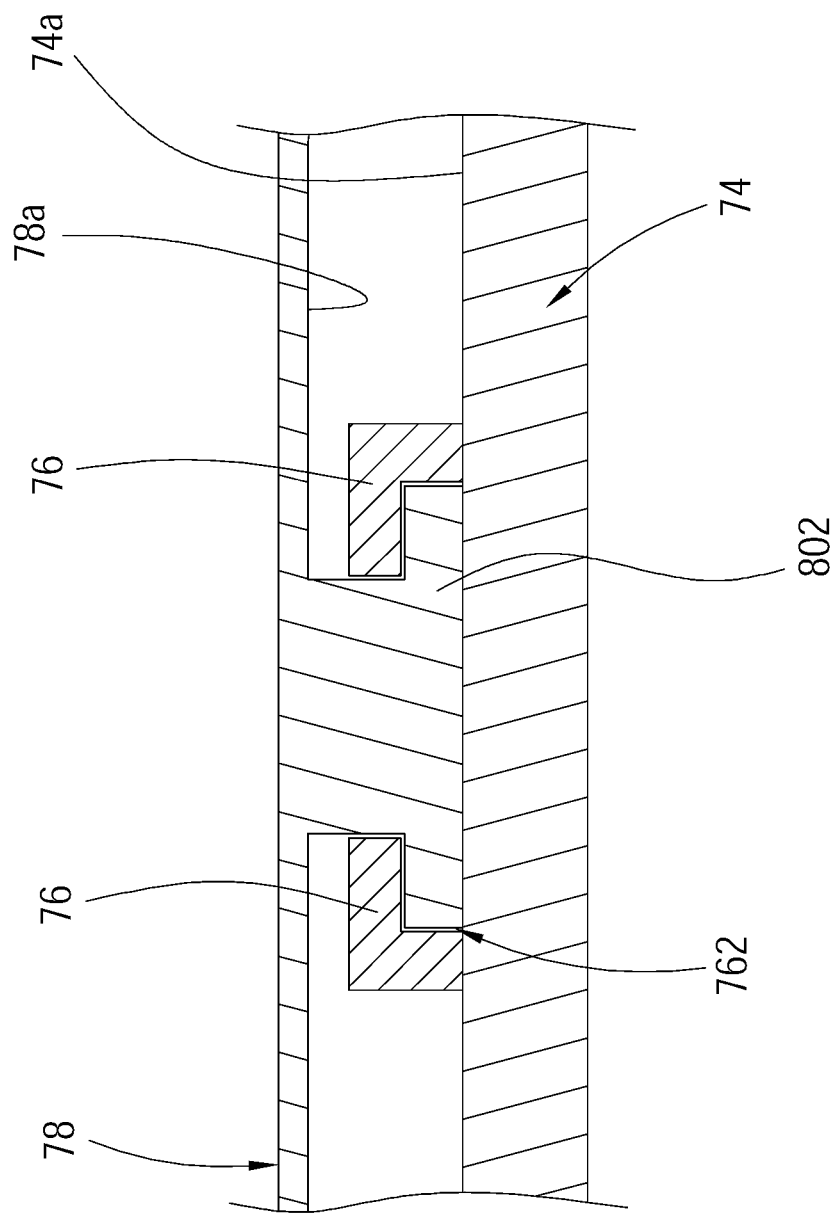
FIG. 22 is a partially sectional view taken along the 22-22 line in FIG. 20.
Figure 23:
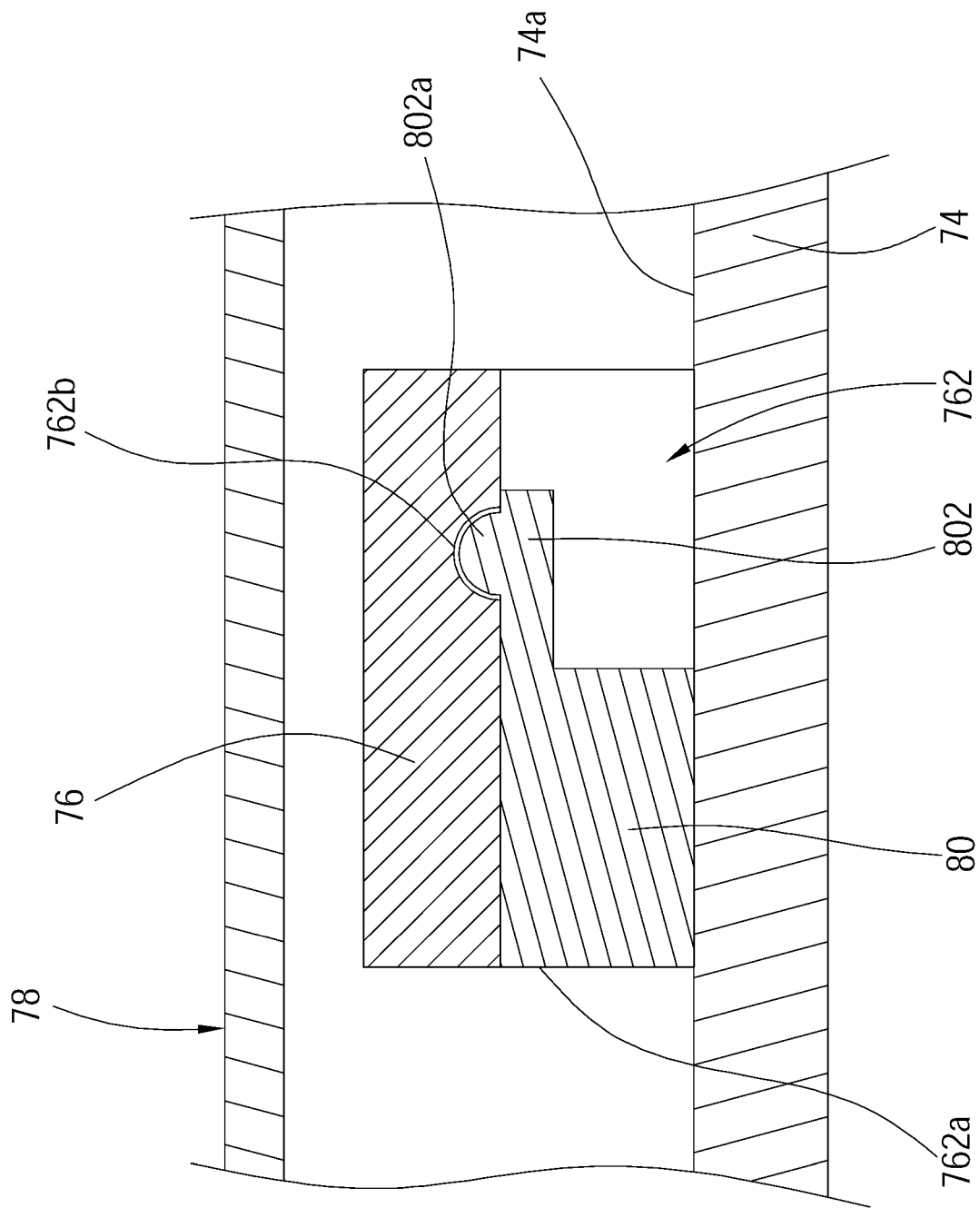
FIG. 23 is a partially sectional view taken along the 23-23 line in FIG. 20.

As shown in FIG. 17 to FIG. 19, an electronic device 5 of a fifth embodiment according to the present invention is similar to that of the first embodiment, and the differences between the electronic device 5 of the fifth embodiment and that of the first embodiment are described as follow. At least one of guiding grooves 70 is disposed with the first positioning portion which is a positioning slot 70a as an example. In the current embodiment, the positioning slot 70a is located on a top portion of an inner wall of a second section 702. At least one of guiding boards 722 of a fixing frame 72 is disposed with the second positioning portion which is a positioning protrusion 722a as an example, wherein a surface of the positioning protrusion 722a is, but not limited to, a curved surface.

When the fixing frame 72 is located in the second position P2, the positioning protrusion 722a is inserted into and engaged with the positioning slot 70a, thereby to restrict a position of the fixing frame 72. When the fixing frame 72 is about to be detached, the positioning protrusion 722a could be detached from the positioning slot 70a by simply moving the fixing frame 72 to the first position P1, As shown in FIG. 20 to FIG. 23, an electronic device 6 of a sixth embodiment according to the present invention is similar to that of the fifth embodiment, and the differences between the electronic device 6 of the sixth embodiment and that of the fifth embodiment are described as follow. Two guiding tracks 76 are disposed on a surface 74a of a case 74, wherein a guiding groove 762 is formed between the guiding tracks 76 and has an open end 762a.

In the current embodiment, a number of a through hole 782 of a fixing frame 78 is one, and a plurality of recessing notches 784 is located on a peripheral edge of the through hole 782. The connectors 200 and the cables 100 are passed through the through hole 782. A guiding board 80 is disposed on a first surface 78a of the fixing frame 78 and a width of the guiding board 80 is complementary to a width of the guiding groove 762. When the fixing frame 78 is moved to the second position P2, the guiding board 80 is inserted into the guiding groove 762 from the open end 762a of the guiding groove 762.

Furthermore, in the current embodiment, the first positioning portion which is a positioning slot 762b as an example is disposed on each of the guiding tracks 76, wherein the positioning slot 762b is located on a top portion of an inner wall of the guiding groove 762 and is in a concave shape. The guiding board 80 has two extending sections 802, wherein an end of each of the extending sections 802 is a free end. The second positioning portion which is a positioning protrusion 802a as an example is disposed on each of the extending sections 802. The surface of the positioning protrusion 802a is a curved surface which complements to the positioning slot 762b. When the fixing frame 78 is located in the second position P2, the positioning protrusion 802a is entered into and is engaged with the positioning slot 762b, thereby to restrict the position of the fixing frame 78. When the fixing frame 78 is about to be detached, the positioning protrusion 802a could be detached from the positioning slot 762b by simply moving the fixing frame 78 to the first position P1, so that the guiding board 80 could be detached from the guiding groove 762.

Figure 24:
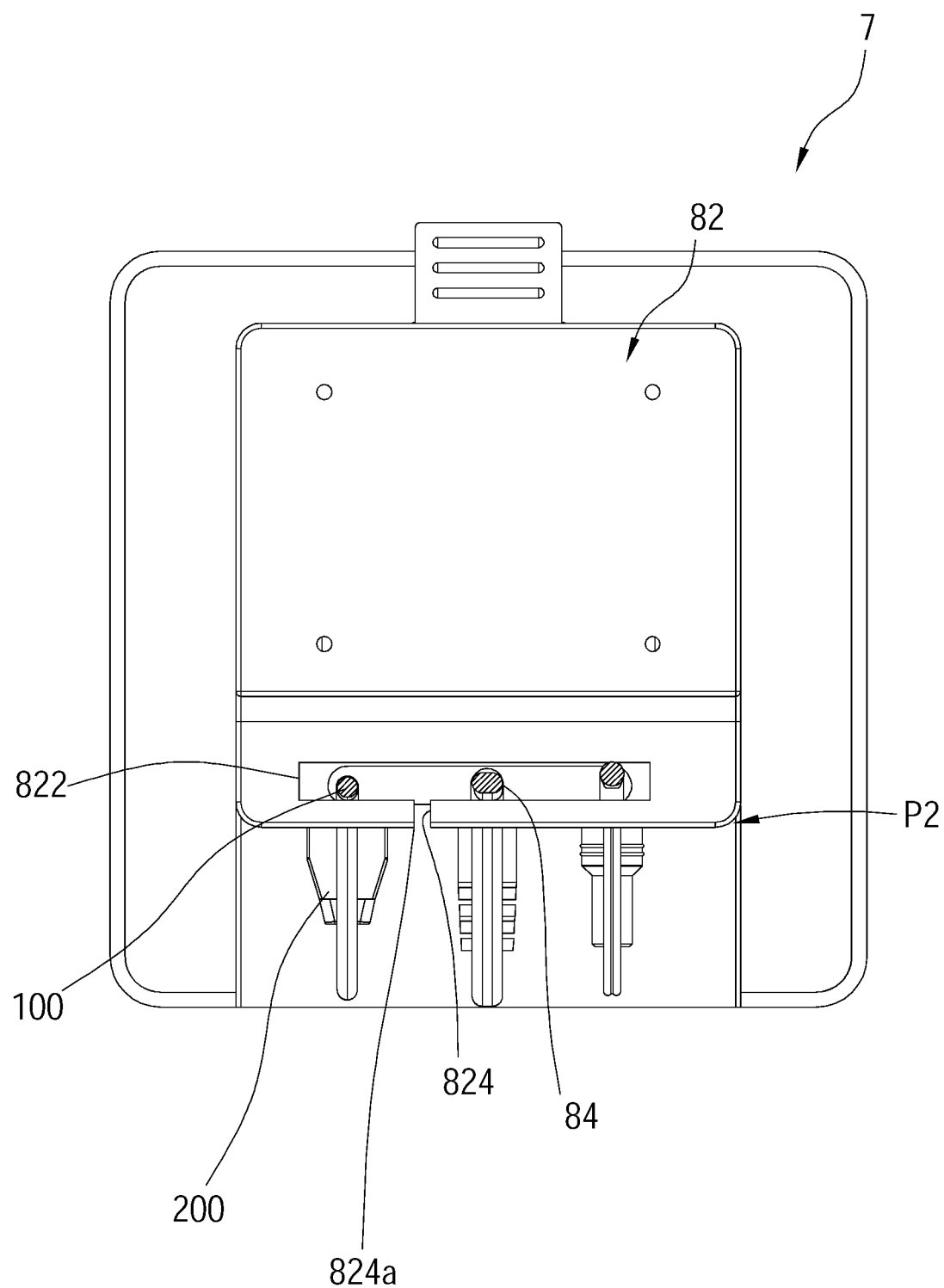
FIG. 24 is a schematic diagram, showing a top view of the electronic device of a seventh embodiment according to the present invention.
Figure 25:
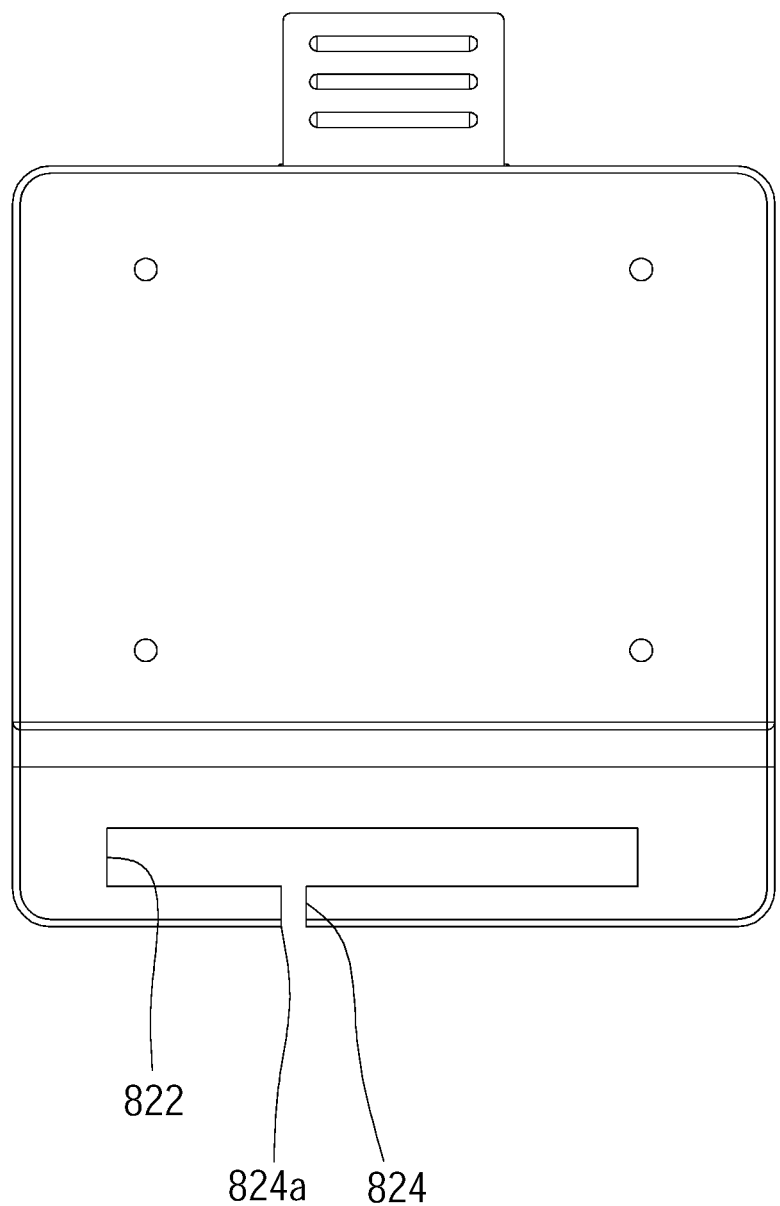
FIG. 25 is a schematic diagram, showing a top view of the fixing frame of the seventh embodiment.

As shown in FIG. 24 and FIG. 25, an electronic device 7 of a seventh embodiment according to the present invention is similar to that of the first embodiment, and the differences between the electronic device 7 of the seventh embodiment and that of the first embodiment are described as follow. A fixing frame 82 has a through hole 822 and a cable slot 824, wherein the through hole 822 constitutes the hollow portion. The connectors 200 are arranged in a longitudinal axis direction of the through hole 822. A peripheral edge of the through hole 822 does not provide with the recessing notches. The second restricting portion is constituted by the peripheral edge of the through hole 822. The through hole 822 communicates with an end of the cable slot 824, and another end of the cable slots 824 is an open end 824a and communicates externally. The user could put the cables 100 into the through hole 822 from the open end 824a of the cable slot 824, and then further restrict the cables 100 in restricting notches 84.

When the fixing frame 82 is located in the second position P2, the peripheral edge of the through hole 822 and the restricting notches 84 jointly restrict the position of the cables 100.

Figure 26:
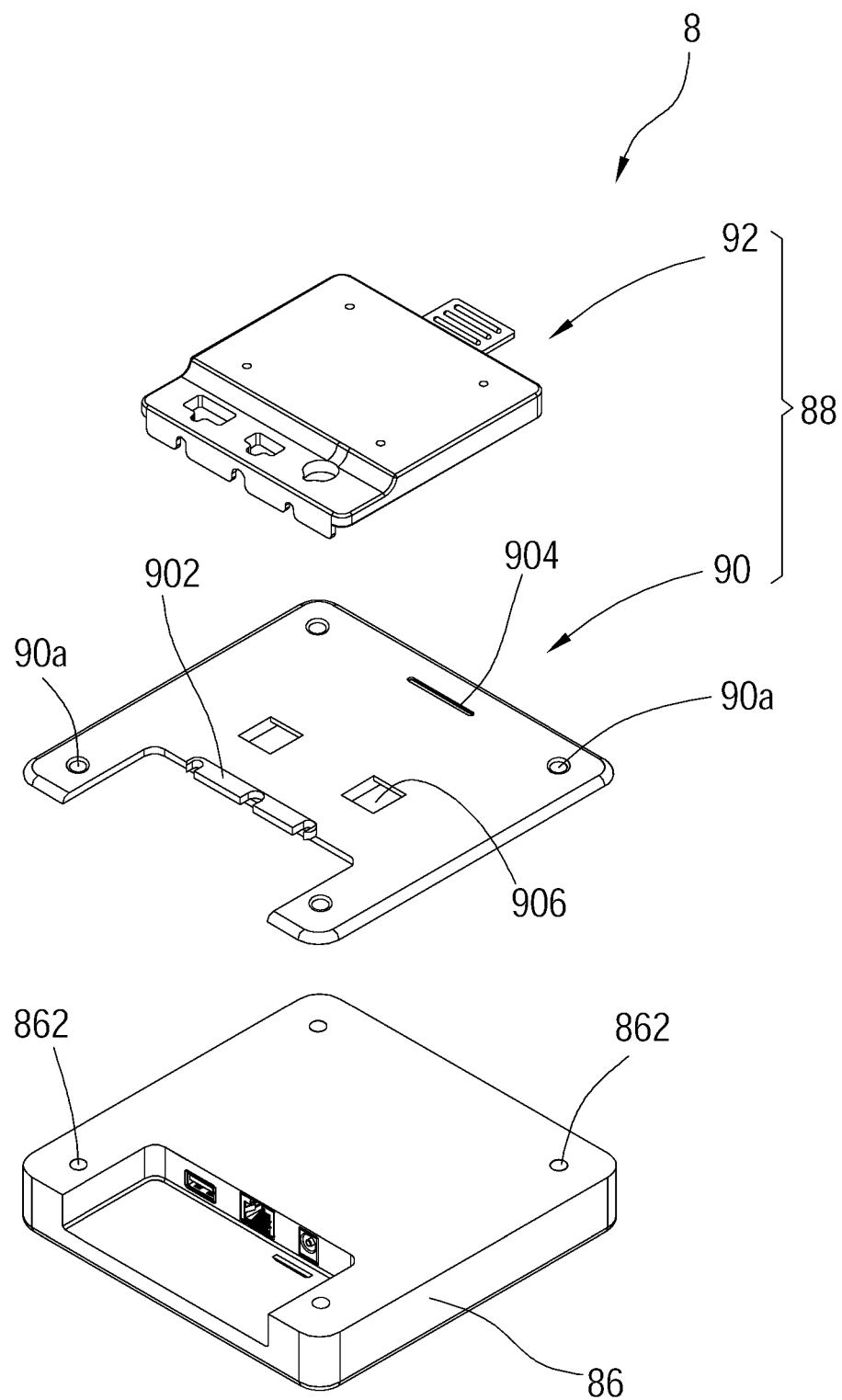
FIG. 26 is an exploded diagram of the electronic device and the cable fixing device of an eighth embodiment according to the present invention.
Figure 27:
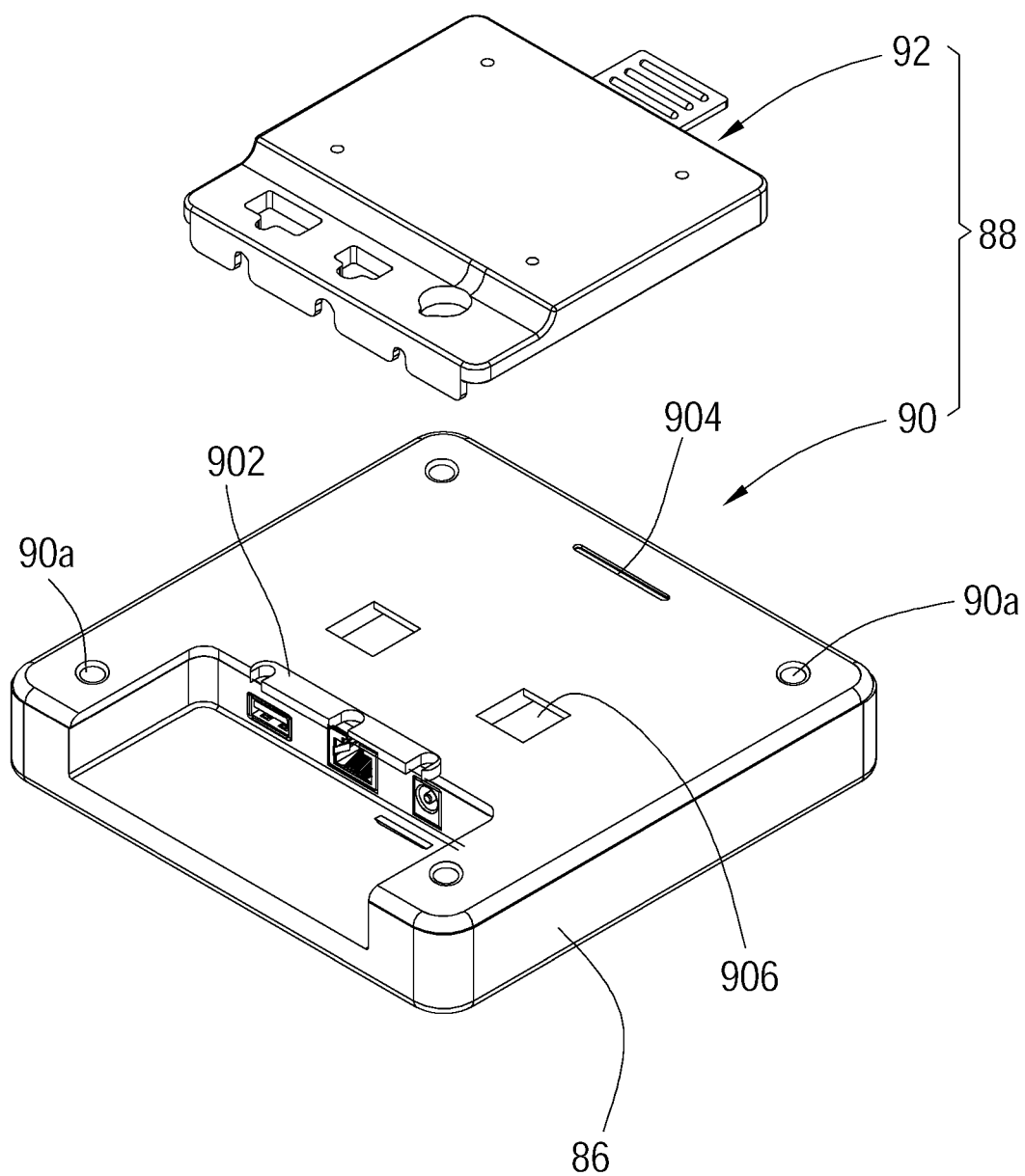
FIG. 27 is a partially exploded diagram of the electronic device and the cable fixing device of the eighth embodiment.

As shown in FIG. 26 and FIG. 27, an electronic device 8 and a cable fixing device 88 of an eighth embodiment according to the present invention are a modified form of the electronic device 1 of the first embodiment. More specifically, a case 86 of the electronic device 8 of the eighth embodiment does not provide with the restricting board, the positioning slot, the guiding grooves, and so on. A plurality of screw holes 862 is disposed on the case 86.

The cable fixing device 88 includes an engaging seat 90 and a fixing frame 92, wherein the engaging seat 90 is adapted to be engaged with the case 86. In the current embodiment, the engaging seat 90 has a plurality of counterbores 90a, wherein each of the counterbores 90a is adapted to be passed through by a screw (not shown), and each of the screws is correspondingly screwed into one of the screw holes 862, thereby to engage the engaging seat 90 and the case 86. The engaging seat 90 includes a restricting board 902, a positioning slot 904, and two guiding grooves 906, and the structures of the restricting board 902, the positioning slot 904, and the guiding grooves 906 are same with those in the first embodiment. In other words, in the current embodiment, the engaging seat 90 engaged with the case 86 is equivalent to the case 10 in the first embodiment, wherein the engaging seat 90 is equivalent to the engaging portion 10a of the first embodiment, and the case 86 is equivalent to the base 10b of the first embodiment. The fixing frame 92 is detachably connected to the engaging seat 90 and is movable relative to the engaging seat 90 between the first position P1 and the second position P2. The fixing frame 92 is same with the fixing frame 26 of the first embodiment, thus we are not going to describe in details herein.

In this way, the objective of fixing the cables 100 could be achieved also by engaging the cable fixing device 88 with the case 86.

It should be noted that the case of the electronic device 2, 3, 4, 5, 6, 7 of the second embodiment to the seventh embodiment could be replaced by the case 86 and the engaging seat 90 in the eighth embodiment. In other words, the engaging seat and the fixing frame of the eighth embodiment modified from the second embodiment to the seventh embodiment form the cable fixing device of the present invention, wherein the cable fixing device could be further engaged with the case of the electronic device, in order to fix the cables connected to the electronic device.

The electronic device and the cable fixing device according to the present invention could fix the cables onto the case, in order to prevent the connection between the cable and the electronic device being affected when the cables are pulled by the external force. Additionally, the cables could be arranged neatly. The cables are not limited to the cable for transmitting signals or power, but could be a cable for anchoring the electronic device such as a security steel cable.

It must be pointed out that the embodiment described above is only a preferred embodiment of the present invention. All equivalent structures which employ the concepts disclosed in this specification and the appended claims should fall within the scope of the present invention.

What is claimed is:

1. An electronic device which is adapted to be connected to at least one cable, comprising:
    a case having at least one first restricting portion, wherein the case is an outer shell of the electronic device, and a circuit board is disposed in the case; and
    a fixing frame which is detachably engaged with the case and has at least one hollow portion and at least one second restricting portion; the at least one hollow portion is adapted to be passed through by the at least one cable, and the at least one second restricting portion is located on a peripheral edge of the at least one hollow portion; the fixing frame is movably engaged with the case in a way that the fixing frame is movable relative to the case between a first position and a second position; when the fixing frame is moved to the first position, the at least one second restricting portion is away from the at least one first restricting portion; when the fixing frame is moved to the second position, the at least one second restricting portion is moved toward the at least one first restricting portion, so that the at least one first restricting portion and the at least one second restricting portion jointly restrict a position of the at least one cable;
    wherein when the fixing frame is located in the second position, a space is constituted by each of the at least one first restricting portion and one of the at least one second restricting portion for one of the at least one cable to pass through, and the cable passing through the space is abutted by the first restricting portion and the second restricting portion.

2. The electronic device of claim 1, wherein the case has a first positioning portion, the fixing frame has a second positioning portion; when the fixing frame is located in the second position, the second positioning portion is engaged with the first positioning portion.

3. The electronic device of claim 2, wherein the fixing frame further comprises a protruding tab which is connected to the second positioning portion; when the fixing frame is located in the second position, the protruding tab is selectively poked by an external force to disengage the second positioning portion from the first positioning portion.

4. The electronic device of claim 1, wherein the case has a first guiding portion, and the fixing frame has a second guiding portion which is detachably engaged with the first guiding portion; when the fixing frame is moved between the first position and the second position, the second guiding portion is moved along the first guiding portion.

5. The electronic device of claim 4, wherein the case has at least one guiding groove constituting the first guiding portion; the fixing frame comprises at least one guiding board constituting the second guiding portion, and the at least one guiding board is inserted into the at least one guiding groove.

6. The electronic device of claim 5, wherein a first positioning portion is disposed in the at least one guiding groove, and a second positioning portion is disposed on the guiding board; when the fixing frame is located in the second position, the second positioning portion is engaged with the first positioning portion.

7. The electronic device of claim 1, wherein the fixing frame has at least one through hole and at least one recessing notch, wherein the at least one through hole constitutes the at least one hollow portion; the at least one recessing notch is located on a peripheral edge of the at least one through hole and communicates with the at least one through hole; the at least one recessing notch constitutes the at least one second restricting portion; when the fixing frame is located in the second position, the at least one cable is located in the at least one recessing notch.

8. The electronic device of claim 7, wherein the fixing frame has at least one fixing notch corresponding to the at least one recessing notch; when the fixing frame is located in the second position, a part of the at least one cable is located in the at least one fixing notch; the case has an edge or at least one restricting notch, wherein the edge has the at least one first restricting portion; when the fixing frame is located in the second position, the at least one cable is located between the at least one recessing notch and the at least one first restricting portion; or the at least one restricting notch constitutes the at least one first restricting portion; when the fixing frame located in the second position, the at least one cable is located between the at least one recessing notches and the at least one restricting notch.

9. The electronic device of claim 1, wherein the fixing frame has at least one through hole and at least one cable slot; the at least one through hole constitutes the at least one hollow portion, and a peripheral edge of the at least one through hole is disposed with the at least one second restricting portion; an end of the at least one cable slot communicates with the at least one through hole, and another end of the at least one cable slot is an opened end and communicates with an outside; the at least one cable enters the at least one through hole via the opened end.

10. A cable fixing device of an electronic device, which is adapted to be engaged with a case of the electronic device, wherein the case is an outer shell of the electronic device and is adapted to be connected to at least one cable; a circuit board is disposed in the case; the cable fixing device comprising:
an engaging seat which is adapted to be engaged with the case and has at least one first restricting portion; and
a fixing frame detachably and movably engaged with the engaging seat, wherein the fixing frame is engaged with the engaging seat in a way that the fixing frame is movable relative to the engaging seat between a first position and a second position, wherein the fixing frame has at least one hollow portion and at least one second restricting portion; the at least one hollow portion is adapted to be passed through by the at least one cable, and the at least one second restricting portion is located on a peripheral edge of the at least one hollow portion; when the fixing frame is moved to the first position, the at least one second restricting portion is away from the at least one first restricting portion; when the fixing frame is moved to the second position, the at least one second restricting portion is moved toward the at least one first restricting portion, so that the at least one second restricting portion and the at least one first restricting portion jointly restrict a position of the at least one cable;
wherein when the fixing frame is located in the second position, a space is constituted by each of the at least one first restricting portion and one of the at least one second restricting portion for one of the at least one cable to pass through, and the cable passing through the space is abutted by the first restricting portion and the second restricting portion.

11. The cable fixing device of an electronic device of claim 10, wherein the engaging seat has a first positioning portion, and the fixing frame has a second positioning portion; when the fixing frame is located in the second position, the second positioning portion is engaged with the first positioning portion.

12. The cable fixing device of an electronic device of claim 11, wherein the fixing frame further comprises a protruding tab connected to the second positioning portion; when the fixing frame is located in the second position, the protruding tab is selectively poked by an external force to disengage the second positioning portion from the first positioning portion.

13. The cable fixing device of an electronic device of claim 10, wherein the engaging seat has a first guiding portion, and the fixing frame has a second guiding portion which is detachably engaged with the first guiding portion; when the fixing frame is moved between the first position and the second position, the second guiding portion is moved along the first guiding portion.

14. The cable fixing device of an electronic device of claim 13, wherein the engaging seat has at least one guiding groove constituting the first guiding portion; the fixing frame comprises at least one guiding board constituting the second guiding portion, and the at least one guiding board is inserted into the at least one guiding groove.

15. The cable fixing device of an electronic device of claim 14, wherein a first positioning portion is disposed in the at least one guiding groove, and a second positioning portion is disposed on the at least one guiding board; when the fixing frame is located in the second position, the second positioning portion is engaged with the first positioning portion.

16. The cable fixing device of an electronic device of claim 10, wherein the fixing frame has at least one through hole and at least one recessing notch; the at least one through hole constitutes the at least one hollow portion; the at least one recessing notch is located on a peripheral edge of the at least one through hole and communicates with the at least one through hole; the at least one recessing notch constitutes the at least one second restricting portion; when the fixing frame is located in the second position, the at least one cable is located in the at least one recessing notch.

17. The cable fixing device of an electronic device of claim 16, wherein the fixing frame has at least one fixing notch corresponding to the at least one recessing notch; when the fixing frame is located in the second position, a part of the at least one cable is located in the at least one fixing notch; the engaging seat has an edge or at least one restricting notch, wherein the edge has the at least one first restricting portion; when the fixing frame is located in the second position, the at least one cable is located between the at least one recessing notch and the at least one first restricting portion; or the at least one restricting notch constitutes the at least one first restricting portion, when the fixing frame located in the second position, the at least one cable is located between the at least one recessing notches and the at least one restricting notch.

18. The cable fixing device of an electronic device of claim 10, wherein the fixing frame has at least one through hole and at least one cable slot; the at least one through hole constitutes the at least one hollow portion, and a peripheral edge of the at least one through hole is disposed with the at least one second restricting portion; an end of the at least one cable slot communicates with the at least one through hole, and another end of the at least one cable slot is an opened end and communicates with an outside; the at least one cable enters the at least one through hole via the opened end.

* * * * *